United States Patent
Hofmeister et al.

(10) Patent No.: US 10,504,763 B2
(45) Date of Patent: Dec. 10, 2019

(54) SUBSTRATE TRANSPORT VACUUM PLATFORM

(71) Applicant: Persimmon Technologies, Corp., Wakefield, MA (US)

(72) Inventors: Christopher Hofmeister, Hampstead, NH (US); Martin Hosek, Lowell, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 0 days.

(21) Appl. No.: 15/841,986

(22) Filed: Dec. 14, 2017

(65) Prior Publication Data
US 2018/0108553 A1 Apr. 19, 2018

Related U.S. Application Data

(62) Division of application No. 14/480,803, filed on Sep. 9, 2014, now abandoned.

(60) Provisional application No. 61/875,275, filed on Sep. 9, 2013.

(51) Int. Cl.
*B66C 23/00* (2006.01)
*H01L 21/677* (2006.01)
*B25J 9/04* (2006.01)

(52) U.S. Cl.
CPC ........ *H01L 21/67742* (2013.01); *B25J 9/042* (2013.01); *Y10S 901/27* (2013.01)

(58) Field of Classification Search
CPC .... H01L 21/67742; B25J 9/042; Y10S 901/27
USPC ..................................................... 414/744.2
See application file for complete search history.

(56) References Cited

U.S. PATENT DOCUMENTS

| | | |
|---|---|---|
| 5,989,346 A | 11/1999 | Hiroki |
| 6,234,738 B1 | 5/2001 | Kimata |
| 6,315,512 B1 | 11/2001 | Tabrizi et al. |
| 6,440,178 B2 | 8/2002 | Berner |
| 6,481,956 B1 | 11/2002 | Hofmeister |
| 6,489,741 B1 | 12/2002 | Genov |
| 6,752,584 B2 | 6/2004 | Woodruff |
| 6,921,467 B2 | 7/2005 | Hanson |
| 7,357,842 B2 | 4/2008 | Ishikawa |
| 7,458,763 B2 | 12/2008 | Van Der Meulen |
| 7,578,649 B2 | 8/2009 | Caveney |
| 7,841,820 B2 | 11/2010 | Bonora et al. |
| 8,136,422 B2 | 3/2012 | Kitahara |
| 8,272,830 B2 | 9/2012 | Kurita et al. |
| 8,459,922 B2 | 6/2013 | Hosek et al. |
| 9,054,146 B2 | 6/2015 | Wi |
| 2004/0151562 A1 | 8/2004 | Hofmeister |
| 2005/0211169 A1 | 9/2005 | Choi |
| 2005/0223837 A1 | 10/2005 | Van Der Meulen |

(Continued)

FOREIGN PATENT DOCUMENTS

| | | |
|---|---|---|
| JP | 06-042602 | 2/1994 |
| JP | 08-066880 | 3/1996 |

(Continued)

*Primary Examiner* — Basil S Katcheves
(74) *Attorney, Agent, or Firm* — Harrington & Smith

(57) ABSTRACT

A transport apparatus including a robot drive; an arm having a first end connected to the robot drive; and at least one end effector connected to a second end of the arm. The arm includes at least three links connected in series to, form the arm. The arm is configured to be moved by the robot drive to move the at least one end effector among load locks and two or more sets of opposing process modules.

18 Claims, 34 Drawing Sheets

(56) References Cited

U.S. PATENT DOCUMENTS

| | | |
|---|---|---|
| 2007/0166135 A1 | 7/2007 | Koike .................. 414/217 |
| 2008/0101892 A1 | 5/2008 | Bonora et al. |
| 2011/0318141 A1 | 12/2011 | Wi |
| 2013/0039726 A1 | 2/2013 | Brodine |
| 2013/0069450 A1 | 3/2013 | Hosek et al. |
| 2013/0071218 A1 | 3/2013 | Hosek et al. |
| 2013/0230369 A1 | 9/2013 | Hofmeister et al. |
| 2013/0230370 A1 | 9/2013 | Hoey et al. |
| 2014/0205416 A1 | 7/2014 | Hosek et al. |

FOREIGN PATENT DOCUMENTS

| | | |
|---|---|---|
| WO | WO-2006062183 A1 | 6/2006 |
| WO | WO-2013/120054 A1 | 8/2013 |

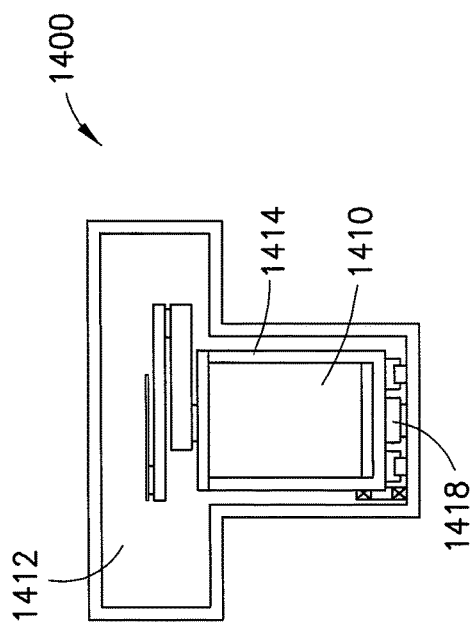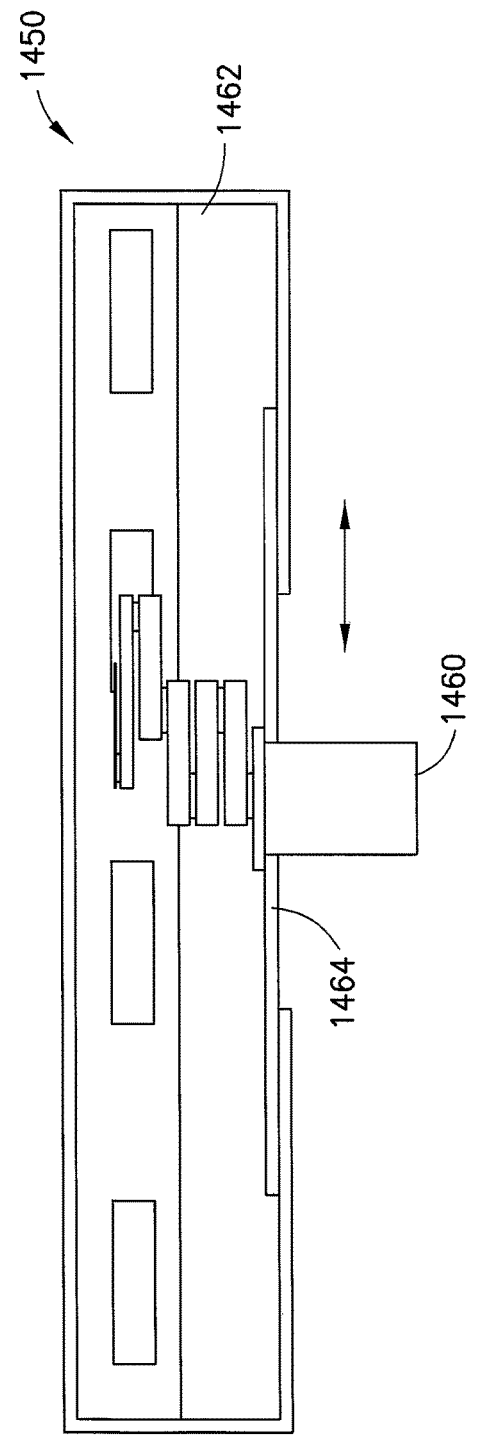

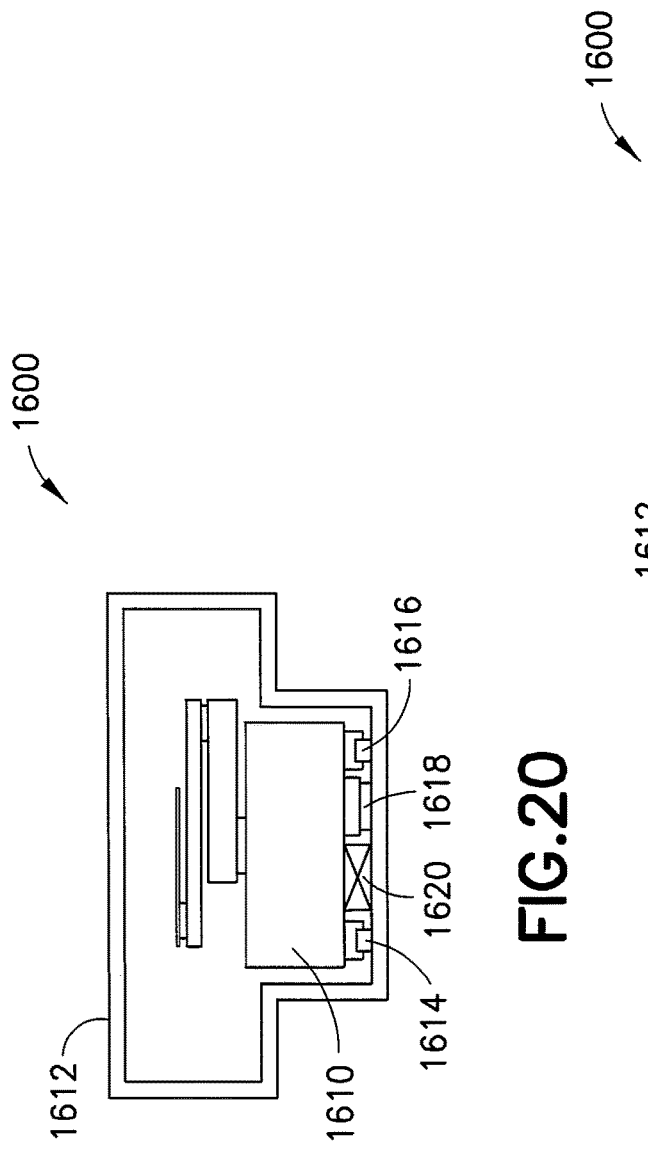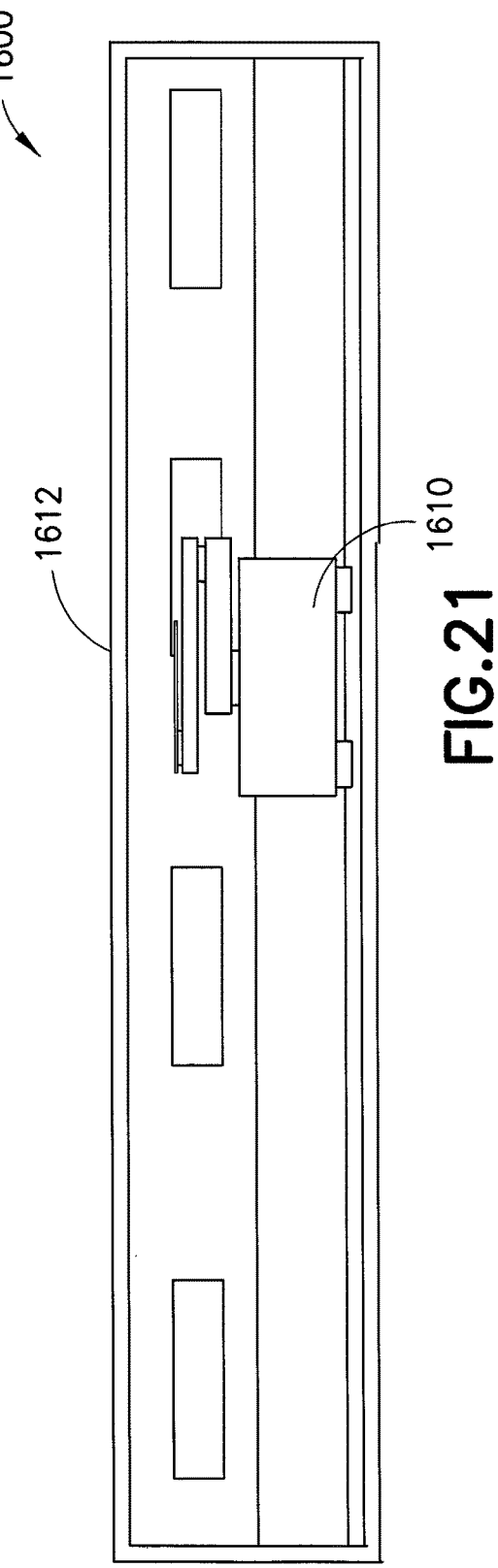

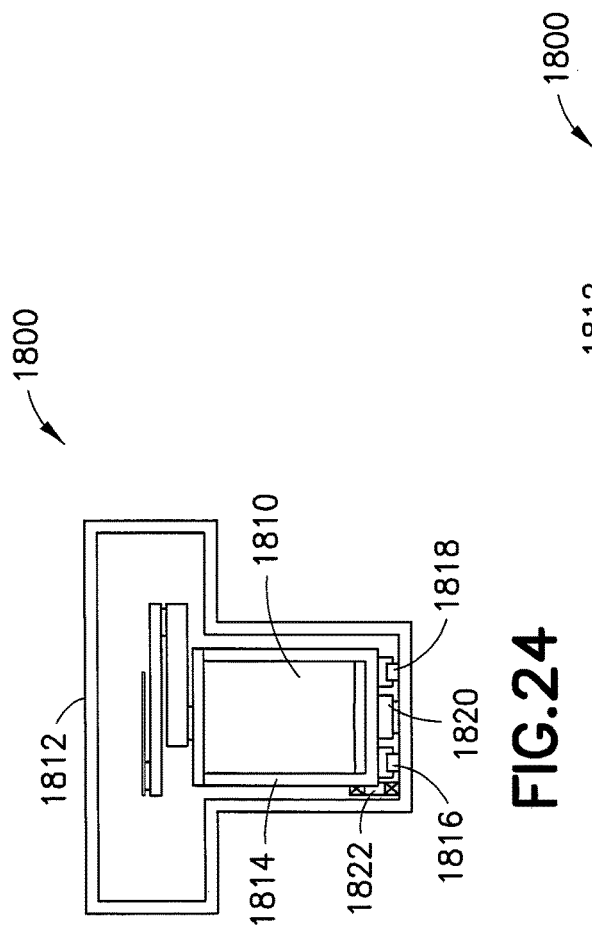
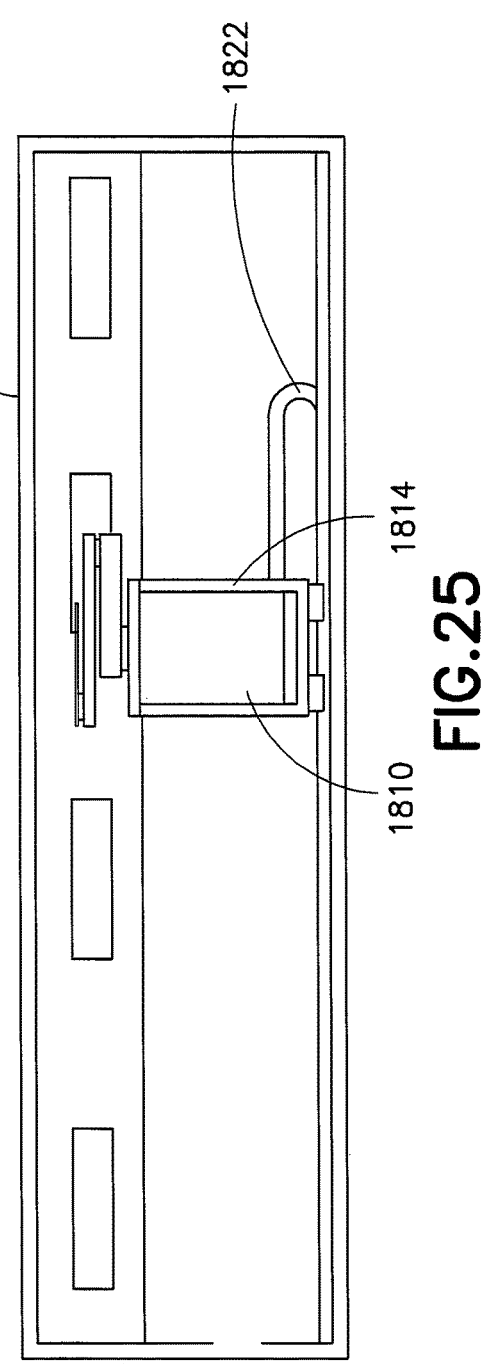
FIG.24
FIG.25

SUBSTRATE TRANSPORT VACUUM PLATFORM

CROSS REFERENCE TO RELATED APPLICATIONS

This application is a divisional patent application of copending application Ser. No. 14/480,803 filed Sep. 9, 2014, which claims priority under 35 USC 119(e) on Provisional Patent Application No. 61/875,275 filed Sep. 9, 2013 which is hereby incorporated by reference in its entirety.

BACKGROUND

Technical Field

The exemplary and non-limiting embodiments relate generally to a system for transporting substrates and, more particularly, to a system for transporting substrates, in vacuum, having a linear configuration.

Brief Description of Prior Developments

Substrate processing systems for semiconductor, LED or other suitable applications may involve the transport of substrates in a vacuum or other suitable environment. In the applications requiring vacuum transport there are platform architectures that involve the use of single or alternately the use of tandem or quad process modules. Single process modules may have a single processing location, whereas tandem or quad process modules may have two processing locations where two substrates may be processed next to each other and picked or placed by a vacuum robot at the same time. The process modules are typically arranged in a radial arrangement on a vacuum chamber having a robot that transfers substrates between the process modules and load locks. A problem arises in the use of process modules where a large number of modules are provided. A large radial transport chamber is required to transport the substrates to and from load locks, and to and from the one or more modules, requiring a large footprint or floor space. With footprint cost at a premium within a micro-electronics fabrication environment, there is a desire for a substrate transport platform with a reduced footprint.

SUMMARY

In accordance with one aspect of the exemplary embodiment, an apparatus is provided comprising a robot drive; an arm having a first end connected to the robot drive; and at least one end effector connected to a second end of the arm, where the arm comprises at least three links connected in series to form the arm, and where the arm is configured to be moved by the robot drive to move the at least one end effector among load locks and two or more sets of opposing process modules.

In accordance with another aspect of the exemplary embodiment, an apparatus is provided comprising a robot drive; an arm having a first end connected to the robot drive; and at least two end effectors connected to a second end of the arm, where the robot drive and the arm are configured to move the at least two end effectors into and/or out of at least two opposing process modules at substantially a same time.

In accordance with another aspect of the exemplary embodiment, an apparatus is provided comprising a transport chamber; a first transport apparatus connected to the transport chamber, where the first transport apparatus comprises a first robot drive, a first arm connected to the first robot drive, and at least one first end effector connected to the first arm, where the at least one end first effector is configured to support at least two devices to be processed thereon; and a second transport apparatus connected to the transport chamber, where the second transport apparatus comprises a second robot drive, a second arm connected to the second robot drive, and at least one second end effector connected to the second arm, where the at least one second end effector is configured to support at least two devices to be processed thereon, where the first and second transport apparatus are configured move the devices to be processed directly between the first and second transport apparatus.

BRIEF DESCRIPTION OF THE DRAWINGS

The foregoing aspects and other features are explained in the following description, taken in connection with the accompanying drawings, wherein:

FIG. 15 is a section view of an example substrate transport platform;

FIG. 16 is a section view of an example substrate transport platform;

FIG. 20 is a section view of an example substrate transport platform;

FIG. 21 is a section view of an example substrate transport platform;

FIG. 24 is a section view of an example substrate transport platform;

FIG. 25 is a section view of an example substrate transport platform;

DETAILED DESCRIPTION OF EXAMPLE EMBODIMENTS

Figure 1:
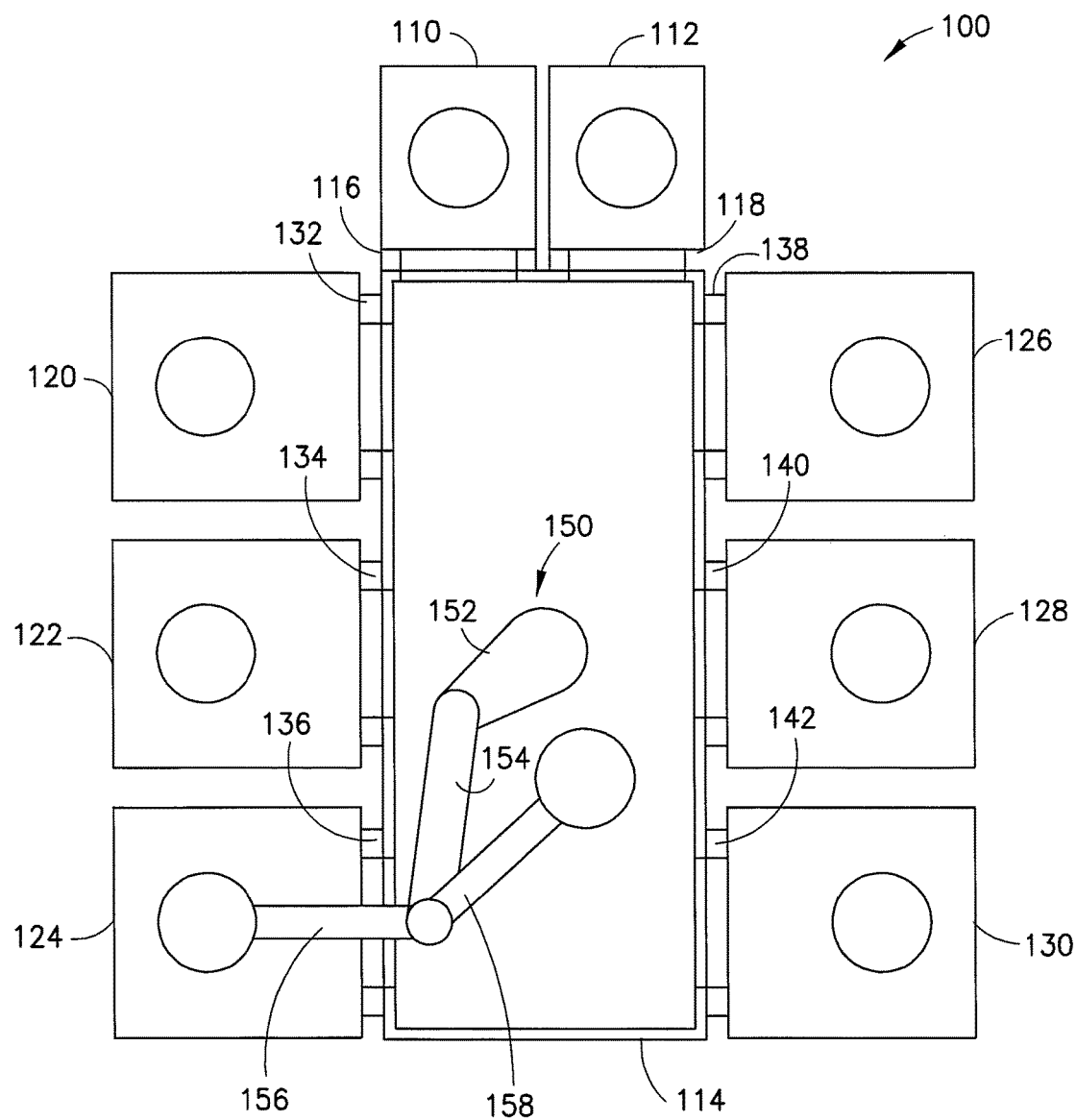
FIG. 1 is a top view of an example substrate transport platform.

Referring to FIG. 1, there is shown a schematic top plan view of an example substrate transport system and robot 100. Although features will be described with reference to the example embodiments shown in the drawings, it should be understood that the present invention may be embodied in many forms of alternative embodiments. In addition, any suitable size, shape or type of materials or elements could be used.

The disclosed embodiment relates to vacuum processing and transport systems for use in the manufacture of semiconductors or other suitable devices. The transport systems shown are directed to systems with rectangular transport chambers but in alternate aspects, the automation may be directed to any suitable system, linear, radial or combinations thereof. Different approaches are considered including providing one or more fixed robots, one or more linear driven robot with a service loop and linear driven robots with no or partial service loop. The disclosed are merely exemplary and combinations and subcombinations of the different examples may be provided to optimize for a given application. Conventional stationary robot drives may be provided with a single robot that transports wafers to all modules or two or more robots where each transports wafers to ½ of the modules or, for example, where each transports wafers to 2 opposing modules. Here, different modes of operation may be supported, for example fast swap with one or more two end effector wafer exchange or single with a one end effector wafer exchange. Further, parallel wafer transport and exchange may be provided if 2 or more robots are provided. With such an approach, PM, module, load lock or otherwise may be added to the end of the tool. Here, footprint depends on robot type and providing two or more robots may require additional handoffs. In the approach where a robot drives on linear track, one or more robots may be provided where each transports wafers to some or all modules. A linear track may be provided, for example, a linear drive and slides where the track length may be full or partial depending on the arm design. Here, a service loop may be provided to provide power, communication, and cooling. Similarly, many different modes of operation may be provided, for example, fast swap, single or parallel wafer transport and exchange if two or more robots are provided. Here, a sealed and cooled robot enclosure (may be potted and unsealed) may be provided. The linear drive may be any suitable drive, band, linear motor or otherwise. The service loop may be any suitable service loop, for example, stainless bellows or otherwise. With the approach where the robot has no or a limited function service loop, the robot may still drive on a linear track and the system may support one or more robots, for example, where each is capable of transport to all of the modules. In this approach, the dominant cooling is done by radiation, for example, to a controlled surface. The two surfaces may be coated, for example, with high emissivity coatings and one or both surfaces may be temperature controlled to ensure an acceptable steady state temperature difference. Similarly, the approach supports different modes of operation, fast swap, single or parallel wafer transport and exchange for example, if two or more robots are provided. Here, a low power consuming robot drive may be provided with thermal transfer to the housing. With radiation cooling heat may be transferred to controlled surface in/of chamber. With power and communication, an exposed conductive loop, inductive, optical, wireless or other suitable coupling(s) may be provided. The linear drive may be band, linear motor or other suitable motor. The slides may be vacuum compatible bearing, magnetic bearing or other suitable bearings.

Vacuum robots disclosed herein may be provided within the vacuum chamber of transport platforms and may have features as disclosed in U.S. patent application Ser. No. 13/618,315 entitled "Robot Drive with Passive Rotor" and filed Sep. 14, 2012. Further, vacuum robots may be provided within the vacuum chamber of a platform and may have features as disclosed in U.S. patent application Ser. No. 13/618,117 entitled "Low Variability Robot" and filed Sep. 14, 2012. Further, vacuum robots may be provided within the a vacuum chamber of a platform and may have features as disclosed in U.S. patent application Ser. No. 13/833,732 entitled "Robot Having Arm With Unequal Link Lengths" and filed Mar. 15, 2013. Further, vacuum robots may be provided within the vacuum chamber of a platform and may have features as disclosed in U.S. patent application Ser. No. 61/831,320 entitled "Robot and Adaptive Placement System and Method" and filed Jun. 5, 2013. Further, vacuum robots may be provided within the vacuum chamber of a platform and may have features as disclosed in U.S. patent application Ser. No. 61/825,162 entitled "Robot with Independent Arms" and filed May 20, 2013. All of the above referenced applications are hereby incorporated by reference herein in their entirety.

Referring to FIG. 1, there is shown a top schematic view of vacuum transport system 100. System 100 has first and second load locks 110, 112 coupled to vacuum transport chamber 114 by isolation valves 116, 118. Process modules 120, 122, 124, 126, 128, 130 are further coupled to chamber 114 by valves 132, 134, 136, 138, 140, 142 respectively. Vacuum transport robot 150 is coupled to chamber 114 to transport substrates between the load locks and process modules. Vacuum transport robot is shown having two links 152, 154 and rotatable end effectors 156, 158. Referenced to 450 mm diameter substrates, such a system may have a width of approximately 1.4 meters. The robot drive may be any suitable robot capable of making compound moves such that the substrate tracks orthogonal to the PM chamber interface. The robot drive may for example, have a 4 rotary axis drive and a z axis drive where the rotary axis drive the shoulder, elbow and two independent wrists. Alternately, additional axes and end effectors may be provided, for example, to support multiple fast swap operations or otherwise.

Figure 2:
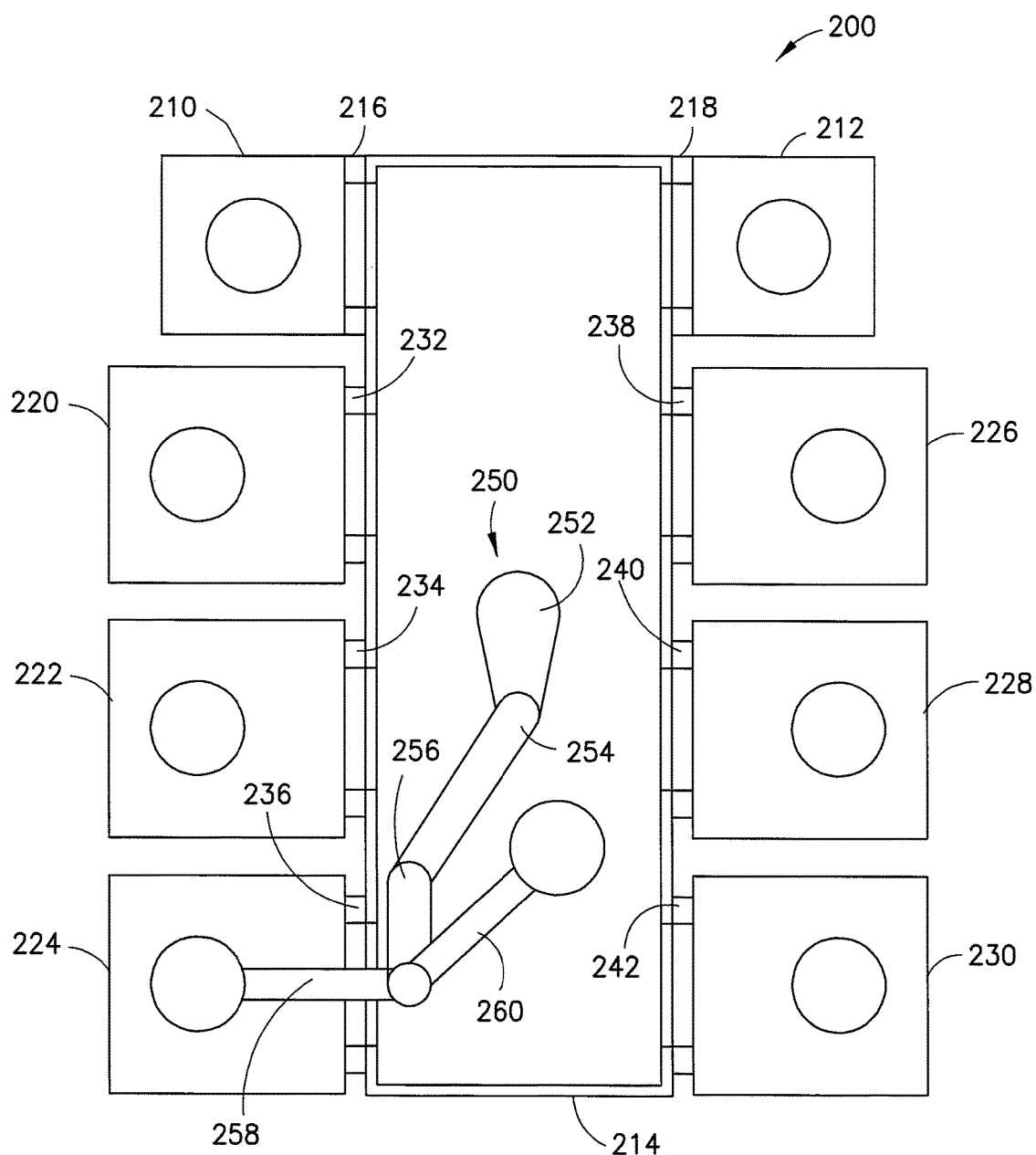
FIG. 2 is a top view of an example substrate transport platform.

Referring to FIG. 2, there is shown a top schematic view of vacuum transport system 200. System 200 has first and second load locks 210, 212 coupled to vacuum transport chamber 214 by isolation valves 216, 218. Process modules 220, 222, 224, 226, 228, 230 are further coupled to chamber 214 by valves 232, 234, 236, 238, 240, 242 respectively. Vacuum transport robot 250 is coupled to chamber 214 to transport substrates between the load locks and process modules. Vacuum transport robot is shown having three links 252, 254, 256 and rotatable end effectors 258, 260. Referenced to 450 mm diameter substrates, such a system may have a width of approximately 1.4 meters. The robot drive may be any suitable robot capable of making compound moves such that the substrate tracks orthogonal to the PM chamber interface. The robot drive may for example, have a 4 rotary axis drive and a z axis drive where the rotary axis drive arm rotation, wrist radial location and two independent wrists. Alternately, additional axes and end effectors may be provided, for example, to support multiple fast swap operations or otherwise.

Figure 3:
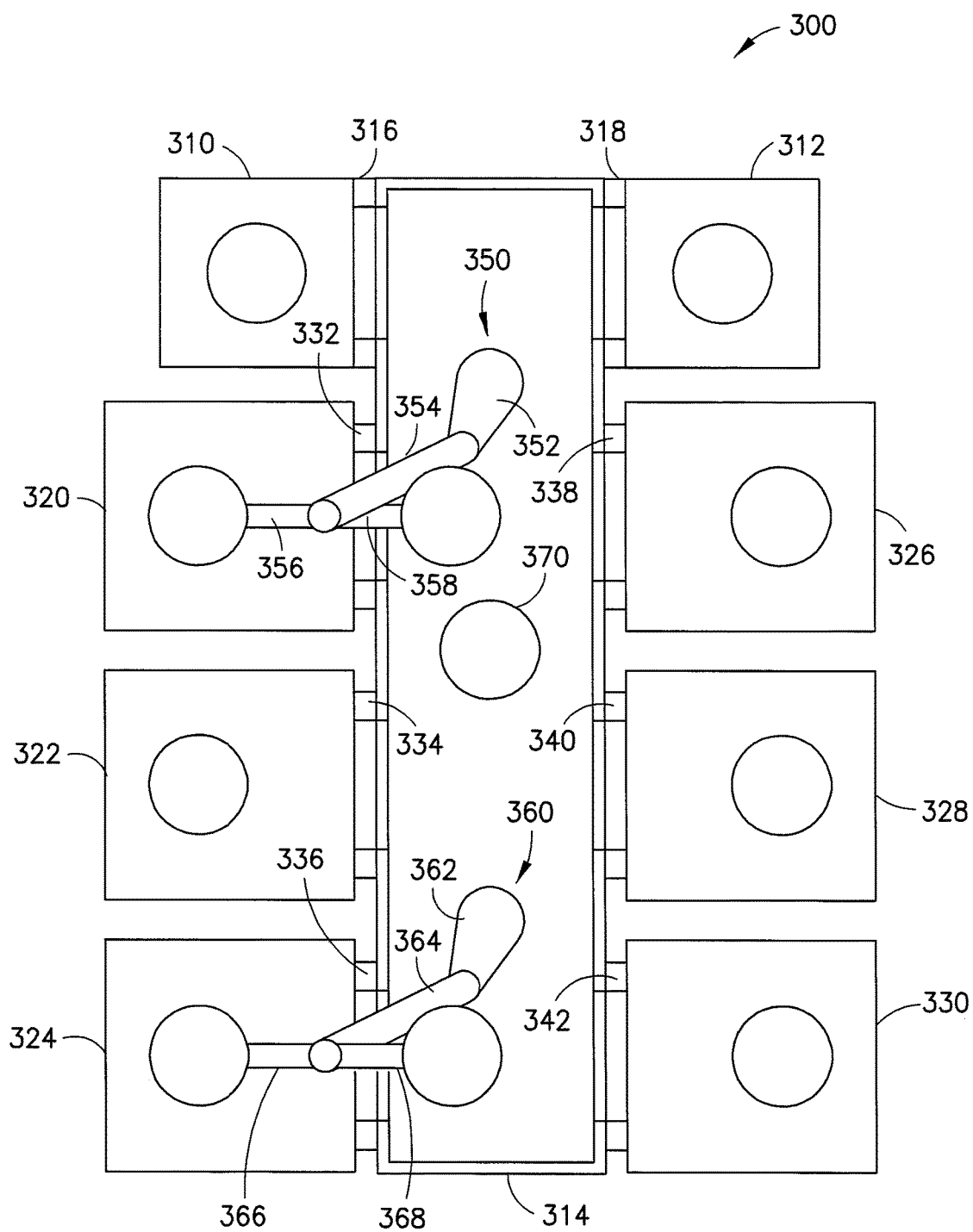
FIG. 3 is a top view of an example substrate transport platform.

Referring to FIG. 3, there is shown a top schematic view of vacuum transport system 300. System 300 has first and second load locks 310, 312 coupled to vacuum transport chamber 314 by isolation valves 316, 318. Process modules 320, 322, 324, 326, 328, 330 are further coupled to chamber 314 by valves 332, 334, 336, 338, 340, 342 respectively. First vacuum transport robot 350 is coupled to chamber 314 to transport substrates between the load locks and process modules 320, 326. First vacuum transport robot is shown having two links 352, 354 and rotatable end effectors 356, 358. Second vacuum transport robot 360 is coupled to chamber 314 to transport substrates between process modules 322, 324, 328, 330. Second vacuum transport robot is shown having two links 362, 364 and rotatable end effectors 366, 368. Buffer support 370 may be provided to hand off wafers between robots 350, 360 and may have multiple shelves. Referenced to 450 mm diameter substrates, such a system may have a width of approximately 1 meter. The robot drives may be any suitable robot capable of making compound moves such that the substrate tracks orthogonal to the PM chamber interface. The robot drive may for example, have a 4 rotary axis drive and a z axis drive where the rotary axis drive the shoulder, elbow and two independent wrists. Alternately, additional axes and end effectors may be provided, for example, to support multiple fast swap operations or otherwise.

Figure 4:
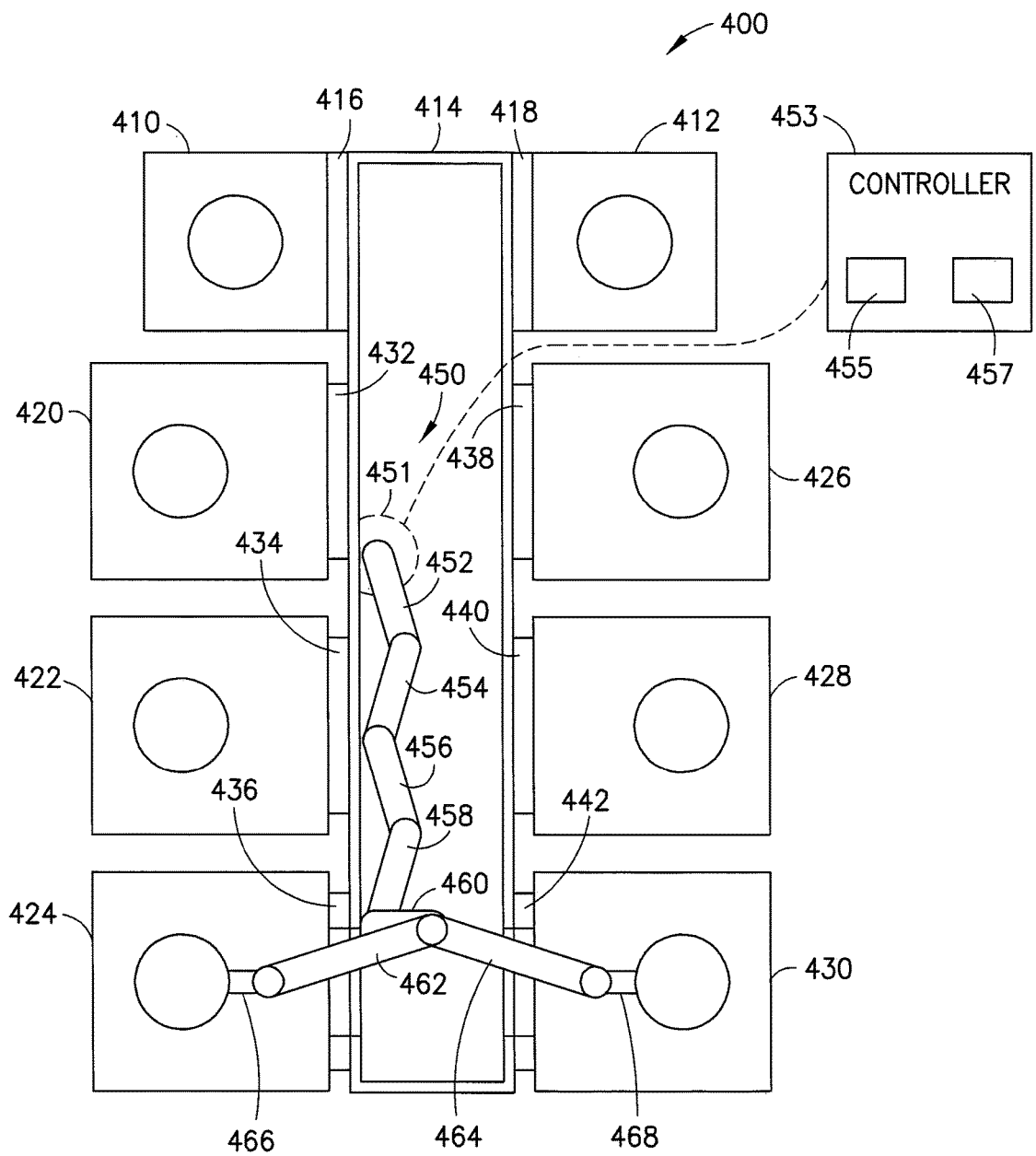
FIG. 4 is a top view of an example substrate transport platform.

Referring to FIG. 4, there is shown a top schematic view of vacuum transport system 400. System 400 has first and second load locks 410, 412 coupled to vacuum transport chamber 414 by isolation valves 416, 418. Process modules 420, 422, 424, 426, 428, 430 are further coupled to chamber 414 by valves 432, 434, 436, 438, 440, 442 respectively. Vacuum transport robot 450 is coupled to chamber 414 to transport substrates between the load locks and process modules. Vacuum transport robot 450 comprises a robot drive 451, an arm with multiple links, and end effectors. The robot drive 451 is connected to the controller 453 which comprises at least one processor 455 and a memory 457 having software code for at least partially controlling movement of the robot 450. The controller 453 as noted above may comprise at least one processor, at least one memory, and software for performing operations, including at least partially controlling movement of the robot, as described herein. Any combination of one or more computer readable medium(s) may be utilized as the memory. The computer readable medium may be a computer readable signal medium or a non-transitory computer readable storage medium. A non-transitory computer readable storage medium does not include propagating signals and may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

The arm is shown having four links 452, 454, 456, 458 coupled to shoulder drive portion 460. In this example the joints between the links 452, 454, 456, 458 have a rotatable movement constraining connection, such as using pulleys for example, such that one joint automatically rotates when another joint rotates. However, one or more of the connections could be a non-constrained connection, such as independent rotary links as in the example shown in FIG. 5. Independent rotary links 462, 464 are coupled to shoulder 460 and each having independent rotatable end effectors 466, 468 at wrist joints. Referenced to 450 mm diameter substrates, such a system may have a width of approximately 0.8 meters. The robot drive may be any suitable robot capable of making compound moves such that the substrate tracks orthogonal to the PM chamber interface. The robot drive may for example, have a 5 rotary axis drive and a z axis drive where the rotary axis drive the location of the elbows, two independent elbows and two independent wrists. Alternately, additional axes and end effectors may be provided, for example, to support multiple fast swap operations or otherwise. In this example the vacuum transport system 400 has the load locks 410, 412 opposing each other. The robot 450 may be controlled to move devices to be processed (such as semiconductor substrates, glass panels, etc.) into and out of the load locks 410, 412 substantially simultaneously on the respective end effectors 466, 468. In this example pairs of the process modules are provided opposing each other 420, 426; 422, 428; and 424, 430. The robot 450 may be controlled to move devices to be processed (such as semiconductor substrates, glass panels, etc.) into and out of the pairs of opposing process modules 420, 426; 422, 428; and 424, 430 substantially simultaneously on the respective end effectors 466, 468. "Opposing" as used herein is intended to mean that the entries into the load locks and process modules substantially face each other with the chamber 414 therebetween.

Figure 5:
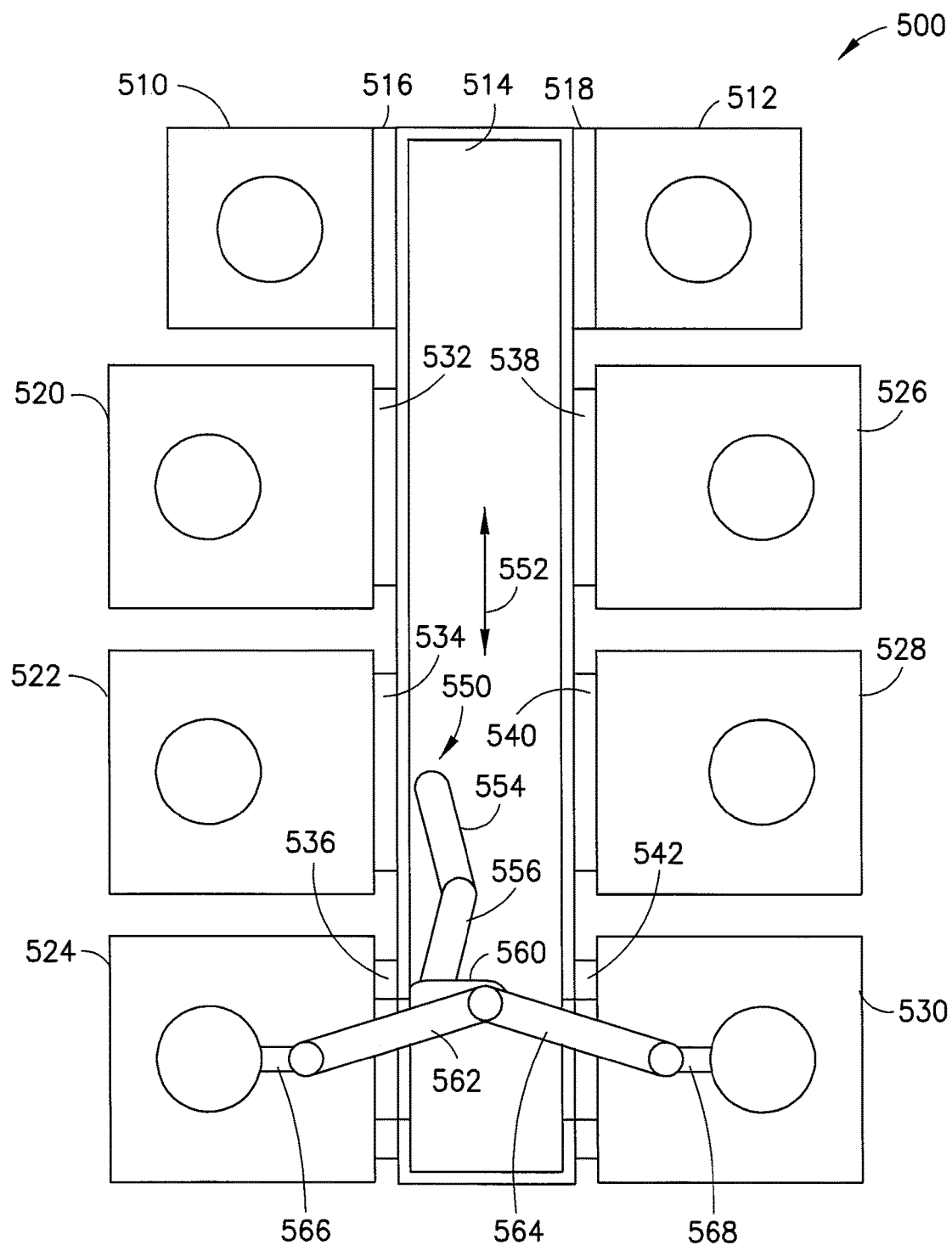
FIG. 5 is a top view of an example substrate transport platform.

Referring to FIG. 5, there is shown a top schematic view of vacuum transport system 500. System 500 has first and second load locks 510, 512 coupled to vacuum transport chamber 514 by isolation valves 516, 518. Process modules 520, 522, 524, 526, 528, 530 are further coupled to chamber 514 by valves 532, 534, 536, 538, 540, 542 respectively. Vacuum transport robot 550 is coupled to chamber 514 by traverser 552 to transport substrates between the load locks and process modules. Vacuum transport robot 550 is shown having two links 554, 556 coupled to shoulder drive portion 560. Independent rotary links 562, 564 are coupled to shoulder 560 and each having independent rotatable end effectors 566, 568 at wrist joints. Referenced to 450 mm diameter substrates, such a system may have a width of approximately 0.7 meters. The robot drive may be any suitable robot capable of making compound moves such that the substrate tracks orthogonal to the PM chamber interface. The robot drive may for example, have a 5 rotary axis drive, a track and a z axis drive where the rotary axis drive the location of the elbows (in combination with the track), two independent elbows and two independent wrists. Alternately, additional axes and end effectors may be provided, for example, to support multiple fast swap operations or otherwise.

Figure 6:
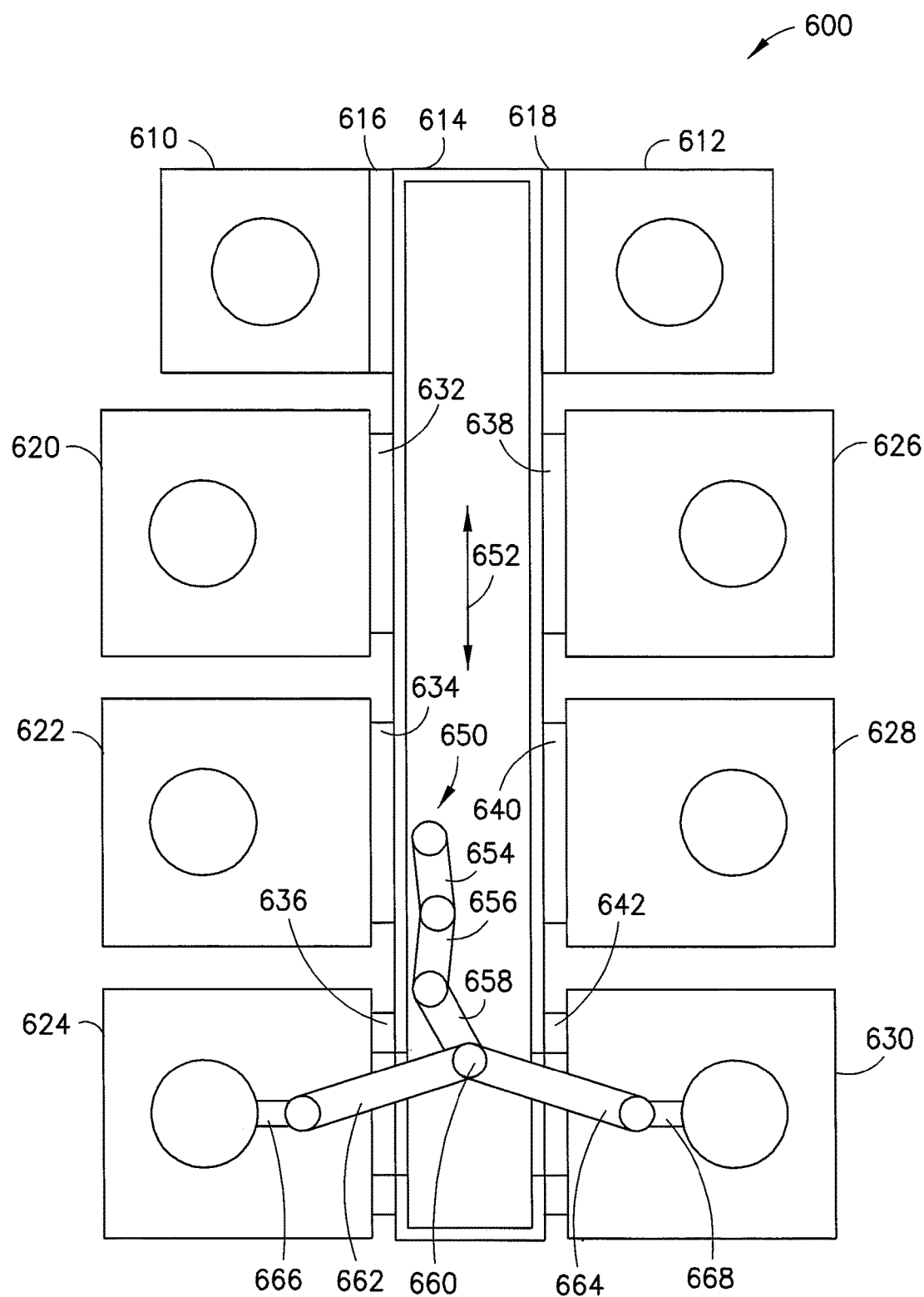
FIG. 6 is a top view of an example substrate transport platform.

Referring to FIG. 6, there is shown a top schematic view of vacuum transport system 600. System 600 has first and second load locks 610, 612 coupled to vacuum transport chamber 614 by isolation valves 616, 618. Process modules 620, 622, 624, 626, 628, 630 are further coupled to chamber 614 by valves 632, 634, 636, 638, 640, 642 respectively. Vacuum transport robot 650 is coupled to chamber 614 by traverser 652 to transport substrates between the load locks and process modules. Vacuum transport robot 650 is shown having three links 654, 656, 658 coupled to shoulder drive portion. Independent rotary links 662, 664 are coupled to shoulder 660 and each having independent rotatable end effectors 666, 668 at wrist joints. Referenced to 450 mm diameter substrates, such a system may have a width of approximately 0.7 meters. The robot drive may be any suitable robot capable of making compound moves such that the substrate tracks orthogonal to the PM chamber interface. The robot drive may for example, have a 5 rotary axis drive, a track and a z axis drive where the rotary axis drive the location of the elbows (in combination with the track), two independent elbows and two independent wrists. Alternately, additional axes and end effectors may be provided, for example, to support multiple fast swap operations or otherwise.

Figure 7:
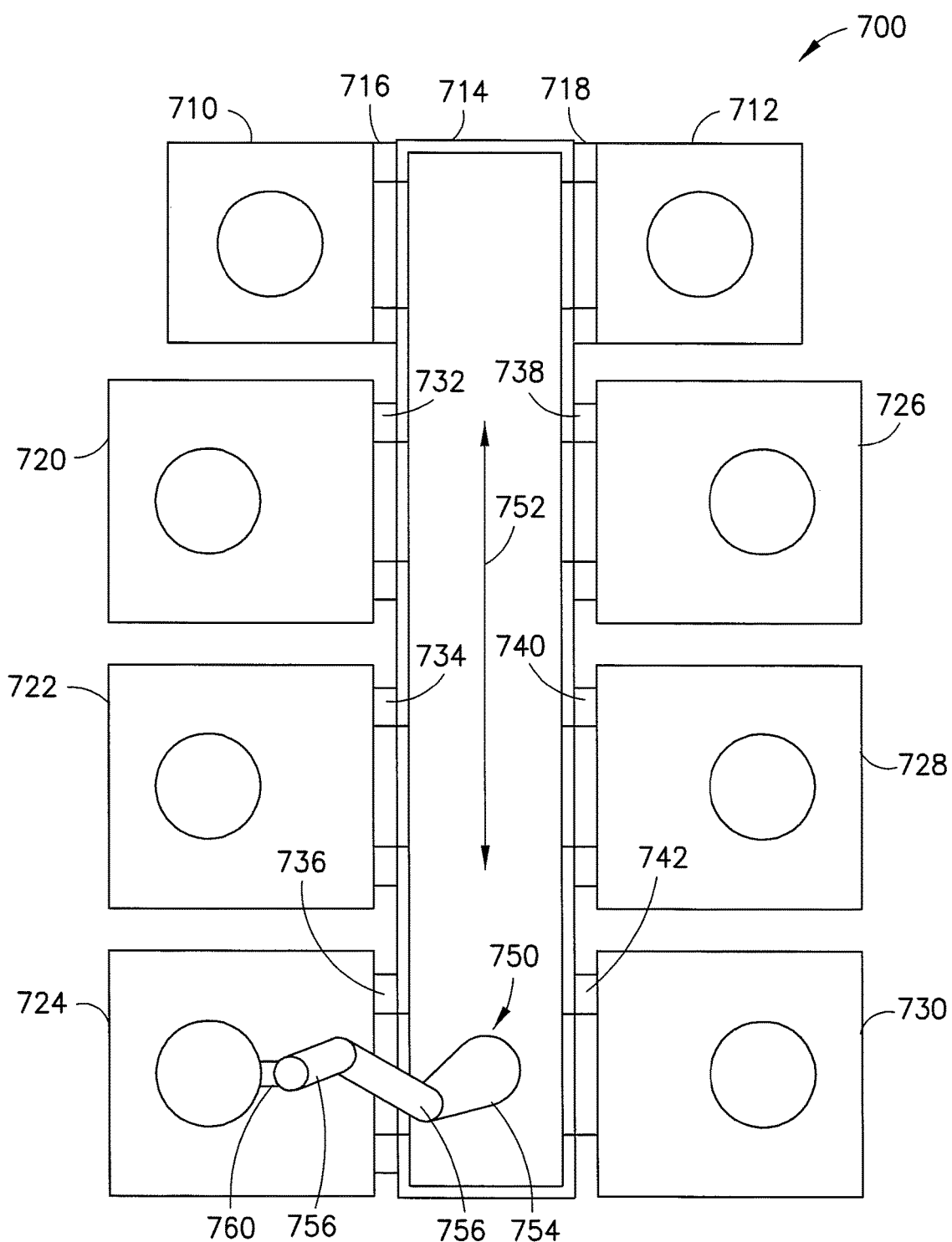
FIG. 7 is a top view of an example substrate transport platform.

Referring to FIG. 7, there is shown a top schematic view of vacuum transport system 700. System 700 has first and second load locks 710, 712 coupled to vacuum transport chamber 714 by isolation valves 716, 718. Process modules 720, 722, 724, 726, 728, 730 are further coupled to chamber 714 by valves 732, 734, 736, 738, 740, 742 respectively. Vacuum transport robot 750 is coupled to chamber 714 by traverser 752 to transport substrates between the load locks and process modules. Vacuum transport robot 750 is shown having three links 754, 756, 758 coupled to end effector 760 at a wrist joint. Referenced to 450 mm diameter substrates, such a system may have a width of approximately 0.8 meters. The robot drive may be any suitable robot capable of making compound moves such that the substrate tracks orthogonal to the PM chamber interface. Alternately, additional axes and end effectors may be provided, for example, to support multiple fast swap operations or otherwise.

Figure 8:
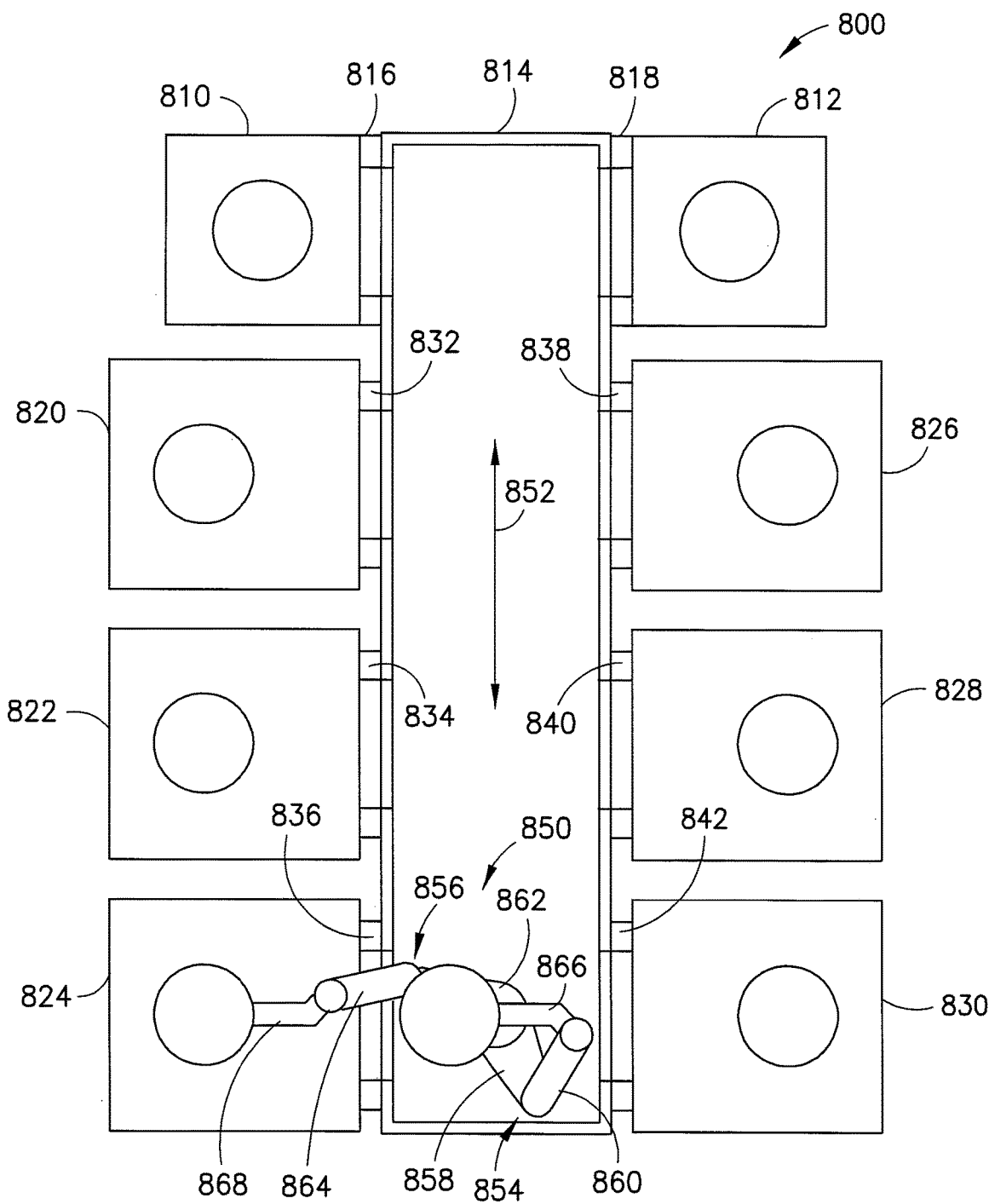
FIG. 8 is a top view of an example substrate transport platform.

Referring to FIG. 8, there is shown a top schematic view of vacuum transport system 800. System 800 has first and second load locks 810, 812 coupled to vacuum transport chamber 814 by isolation valves 816, 818. Process modules 820, 822, 824, 826, 828, 830 are further coupled to chamber 814 by valves 832, 834, 836, 838, 840, 842 respectively. Vacuum transport robot 850 is coupled to chamber 814 by traverser 852 to transport substrates between the load locks and process modules. Vacuum transport robot 850 is shown having dual arms 854, 856 each with two links 858, 560, 862, 864 coupled to end effectors 866, 868 at wrist joints. Referenced to 450 mm diameter substrates, such a system may have a width of approximately 1 meter. The robot drive may be any suitable robot capable of making compound moves such that the substrate tracks orthogonal to the PM chamber interface. Alternately, additional axes and end effectors may be provided, for example, to support multiple fast swap operations or otherwise.

Figure 9:
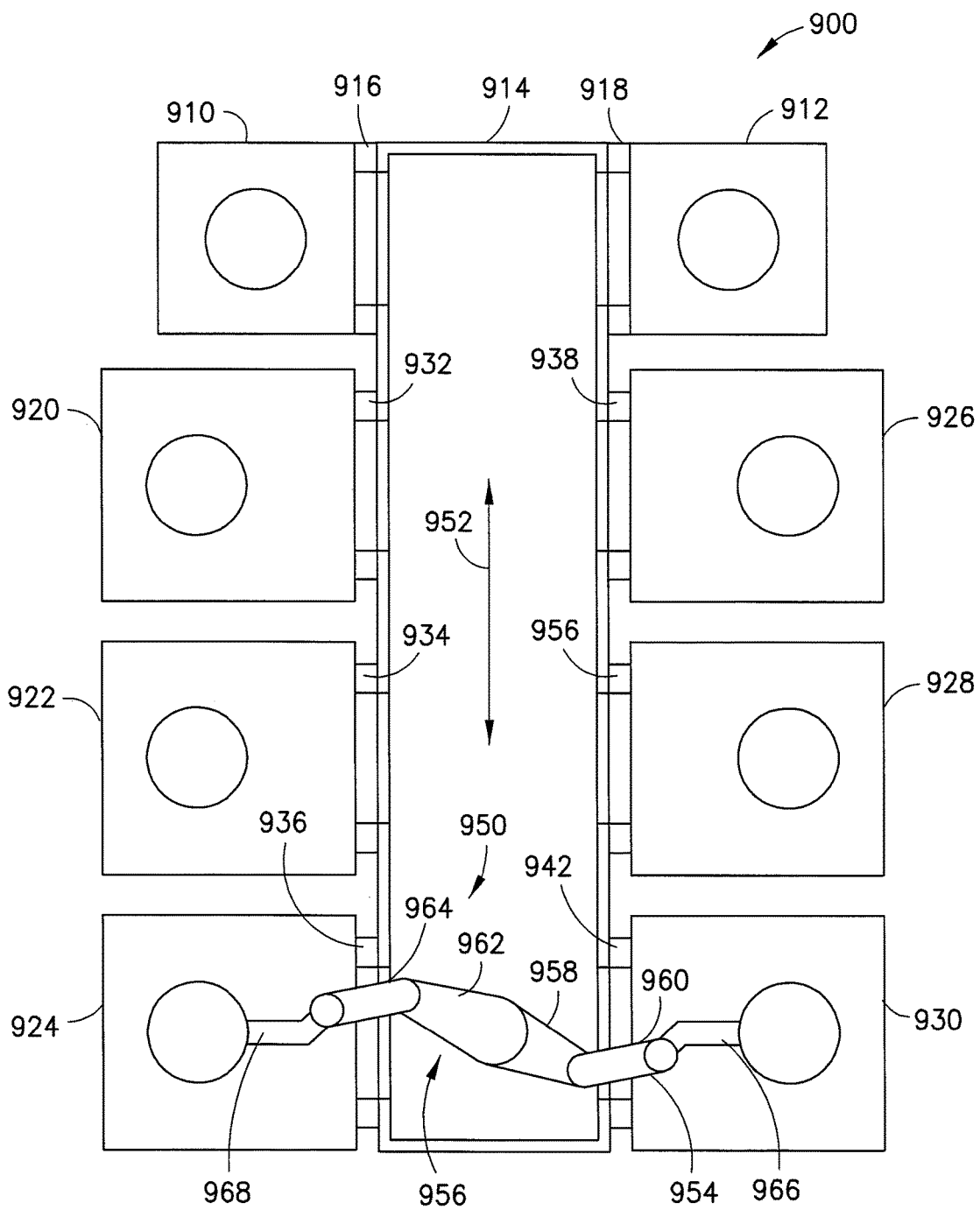
FIG. 9 is a top view of an example substrate transport platform.

Referring to FIG. 9, there is shown a top schematic view of vacuum transport system 900. System 900 has first and second load locks 910, 912 coupled to vacuum transport chamber 914 by isolation valves 916, 918. Process modules 920, 922, 924, 926, 928, 930 are further coupled to chamber 914 by valves 932, 934, 936, 938, 940, 942 respectively. Vacuum transport robot 950 is coupled to chamber 914 by traverser 952 to transport substrates between the load locks and process modules. Vacuum transport robot 950 is shown having dual arms 954, 956 each with two links 958, 960, 962, 964 coupled to end effectors 966, 968 at wrist joints. Referenced to 450 mm diameter substrates, such a system may have a width of approximately 1 meter. The robot drive may be any suitable robot capable of making compound moves such that the substrate tracks orthogonal to the PM chamber interface. Alternately, additional axes and end effectors may be provided, for example, to support multiple fast swap operations or otherwise.

Figure 10:
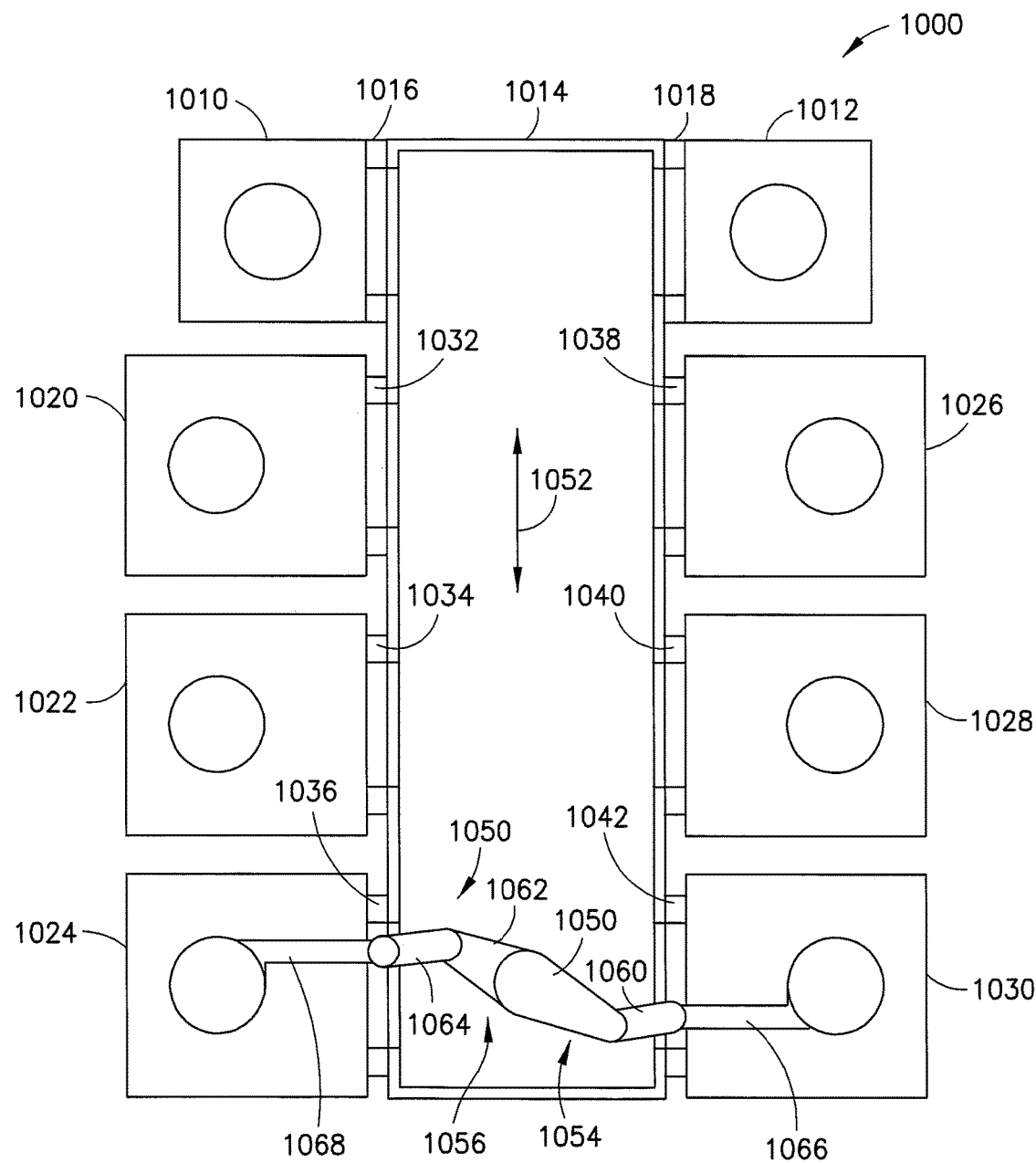
FIG. 10 is a top view of an example substrate transport platform.

Referring to FIG. 10, there is shown a top schematic view of vacuum transport system 1000. System 1000 has first and second load locks 1010, 1012 coupled to vacuum transport chamber 1014 by isolation valves 1016, 1018. Process modules 1020, 1022, 1024, 1026, 1028, 1030 are further coupled to chamber 1014 by valves 1032, 1034, 1036, 1038, 1040, 1042 respectively. Vacuum transport robot 1050 is coupled to chamber 1014 by traverser 1052 to transport substrates between the load locks and process modules. Vacuum transport robot 1050 is shown having dual arms 1054, 1056 each with two links 1058, 1060, 1062, 1064 coupled to end effectors 1066, 1068 at wrist joints. Referenced to 450 mm diameter substrates, such a system may have a width of approximately 1.1 meters. The robot drive may be any suitable robot capable of making compound moves such that the substrate tracks orthogonal to the PM chamber interface. Alternately, additional axes and end effectors may be provided, for example, to support multiple fast swap operations or otherwise.

Figure 11:
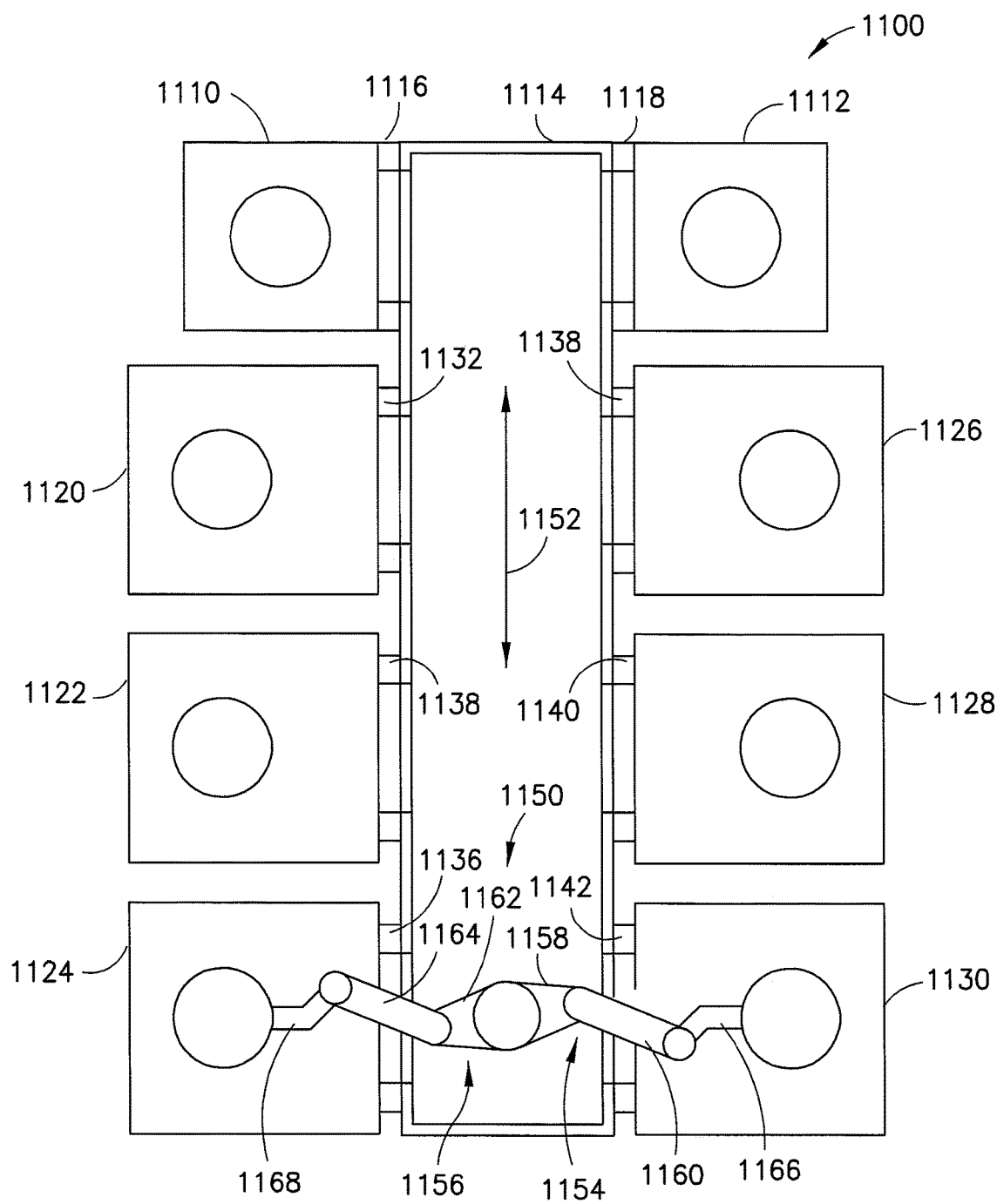
FIG. 11 is a top view of an example substrate transport platform.

Referring to FIG. 11, there is shown a top schematic view of vacuum transport system 1100. System 1100 has first and second load locks 1110, 1112 coupled to vacuum transport chamber 1114 by isolation valves 1116, 1118. Process modules 1120, 1122, 1124, 1126, 1128, 1130 are further coupled to chamber 1114 by valves 1132, 1134, 1136, 1138, 1140, 1142 respectively. Vacuum transport robot 1150 is coupled to chamber 1114 by traverser 1152 to transport substrates between the load locks and process modules. Vacuum transport robot 1150 is shown having dual arms 1154, 1156 each with two links 1158, 1160, 1162, 1164 coupled to end effectors 1166, 1168 at wrist joints. Referenced to 450 mm diameter substrates, such a system may have a width of approximately 1 meter. The robot drive may be any suitable robot capable of making compound moves such that the substrate tracks orthogonal to the PM chamber interface. Alternately, additional axes and end effectors may be provided, for example, to support multiple fast swap operations or otherwise.

Figure 12:
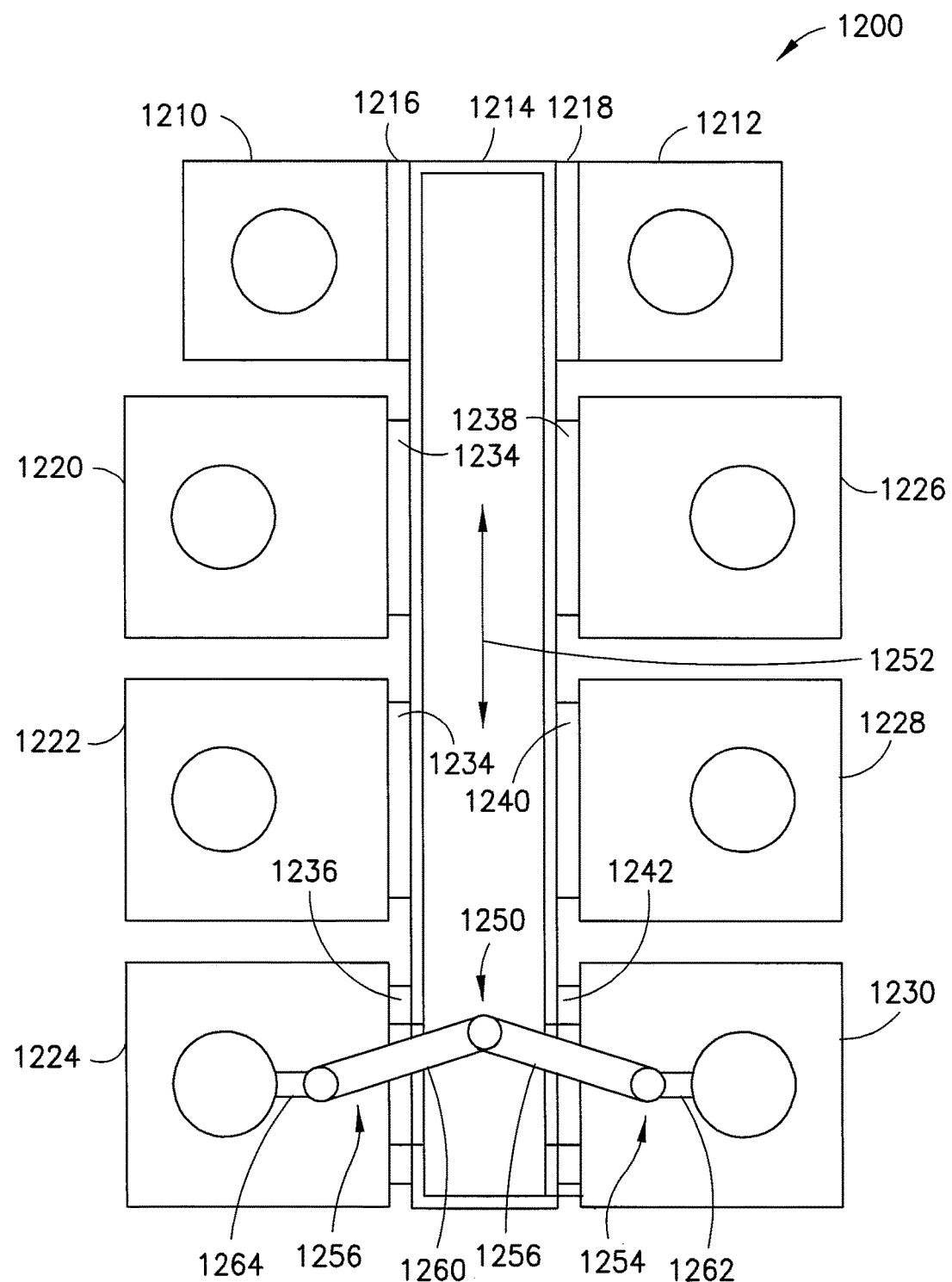
FIG. 12 is a top view of an example substrate transport platform.

Referring to FIG. 12, there is shown a top schematic view of vacuum transport system 1200. System 1200 has first and second load locks 1210, 1212 coupled to vacuum transport chamber 1214 by isolation valves 1216, 1218. Process modules 1220, 1222, 1224, 1226, 1228, 1230 are further coupled to chamber 1214 by valves 1232, 1234, 1236, 1238, 1240, 1242 respectively. Vacuum transport robot 1250 is coupled to chamber 1214 by traverser 1252 to transport substrates between the load locks and process modules. Vacuum transport robot 1250 is shown having dual arms 1254, 1256 each with a single link 1258, 1260 coupled to end effectors 1262, 1264 at wrist joints. Referenced to 450 mm diameter substrates, such a system may have a width of approximately 0.7 meters. The robot drive may be any suitable robot capable of making compound moves such that the substrate tracks orthogonal to the PM chamber interface. Alternately, additional axes and end effectors may be provided, for example, to support multiple fast swap operations or otherwise.

Figure 13:
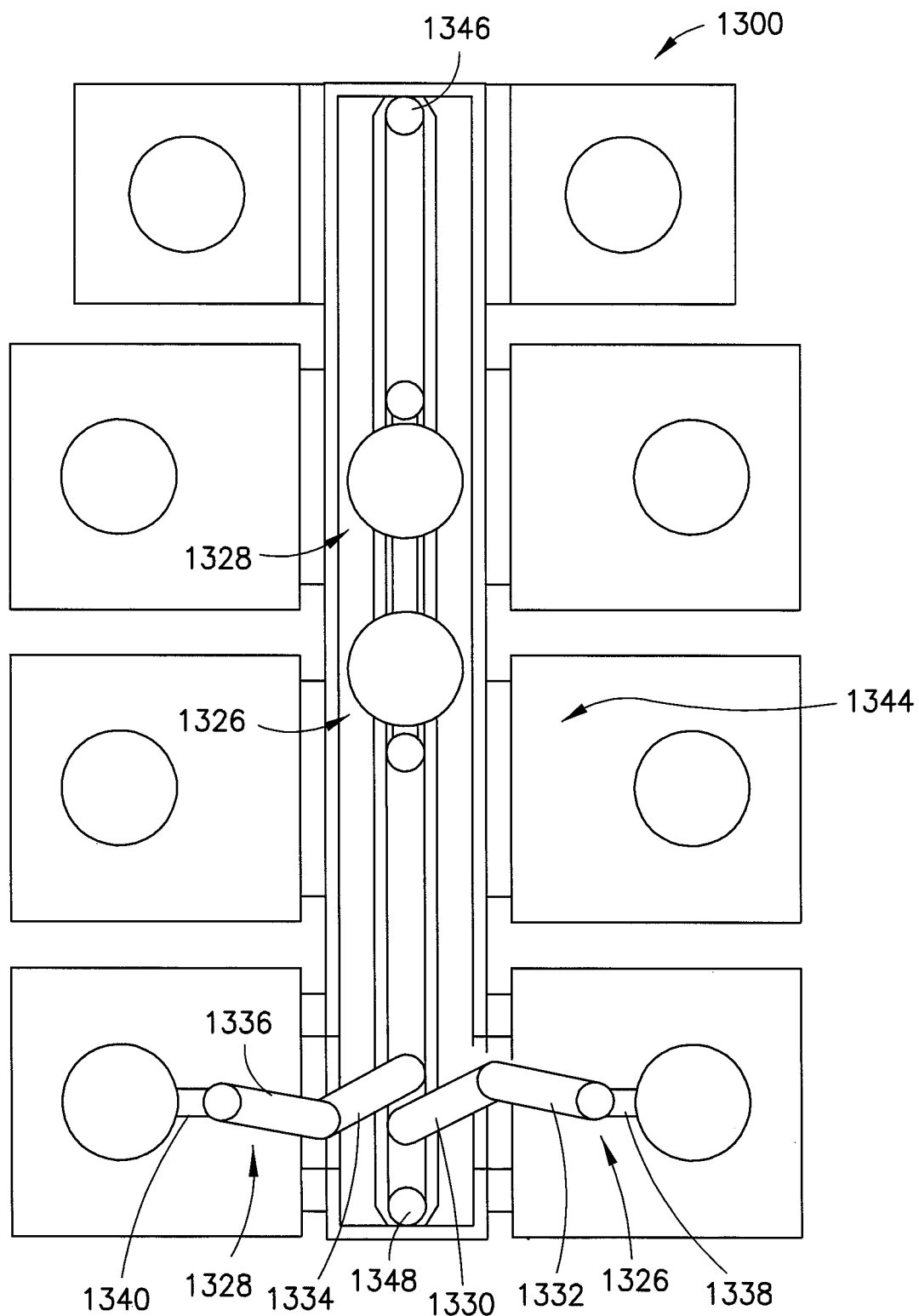
FIG. 13 is a top view of an example substrate transport platform.
Figure 14:
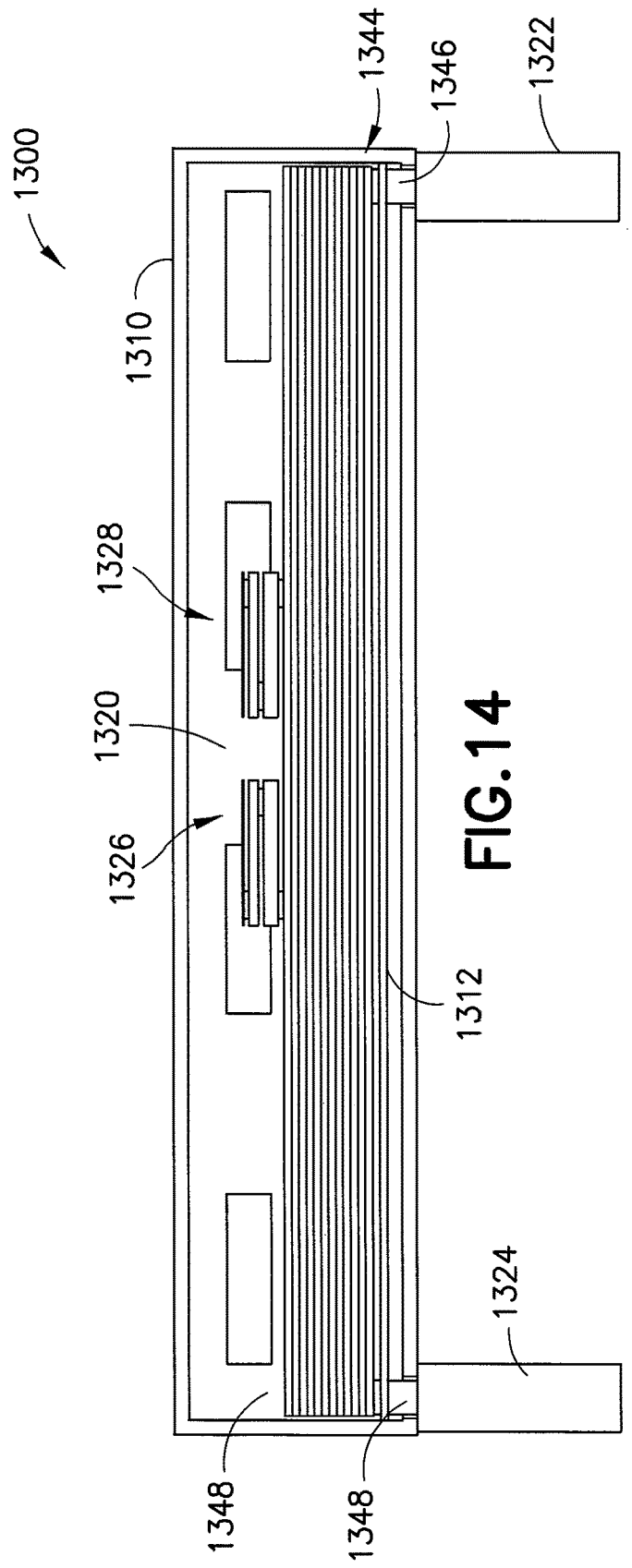
FIG. 14 is a section view of an example substrate transport platform.

Referring to FIG. 13 and FIG. 14, there are shown top and side schematic views of vacuum transport system 1300. System 1300 similarly has first and second load locks coupled to vacuum transport chamber 1310 by isolation valves. Process modules are further coupled to chamber 1310 by valves respectively. Vacuum transport robot 1320 is coupled to chamber 1310 with first and second robot drives 1322, 1324 to transport substrates between the load locks and process modules. The robot drives may each have a vertical (z) axis and tri axial rotary axes. Vacuum transport robot 1320 is shown having dual arms 1326, 1328 each with two links 1330, 1332, 1334, 1336 coupled to end effectors 1338, 1340 at wrist joints. Robot drives 1322, 1324 are coupled by bridge 1342. Bridge 1342 has a slide on which both arms 1326, 1328 may be independently be moved. 6 bands 1344 are coupled to drum drives 1346, 1348 of the respective robot drives. Here, the tri axial drives drive the drums which in turn are coupled three each to corresponding carriage and drums of arms 1326, 1328 to selectively and independently extend the arm, rotate the end effector and traverse the arm. FIG. 13 shows each arm in both extended and retracted positions. Referenced to 450 mm diameter substrates, such a system may have a width of approximately 0.7 meters. The robot drive may be any suitable robot capable of making compound moves such that the substrate tracks orthogonal to the PM chamber interface. Alternately, additional axes and end effectors may be provided, for example, to support multiple fast swap operations or otherwise.

Referring to FIG. 15 there is shown an end section schematic view of vacuum system 1400. Here one method of traversing robot 1410 in vacuum chamber 1412 is shown. Robot 1410 may be a conventional vacuum robot enclosed within sealed enclosure 1414 and traversing on slides 1416 and driven by linear motor 1418. Sealed service loop 1420 is provided and as will be described in greater detail provides coolant, power and communication to robot 1410 from atmosphere.

Referring to FIG. 16 there is shown a side section schematic view of vacuum system 1450. Here one method of traversing robot 1460 in vacuum chamber 1462 is shown. Robot 1460 may be a conventional vacuum robot sealed to sliding plate 1460 and traversing on slides and driven by a linear motor or any suitable drive. Here, robot 1460 is exposed to atmosphere where a combination air/vacuum bearing is provided between chamber 1462 and plate 1464. Alternately, convention seals may be provided, for example, differentially pumped seals or ferrofluid seals. Example seals may be seen in U.S. Pat. Nos. 6,515,288, 5,103,102, 4,726,689, 6,445,440, 4,502,700, 2011/0076119 each of which is incorporated by reference herein in its entirety.

Figure 18:
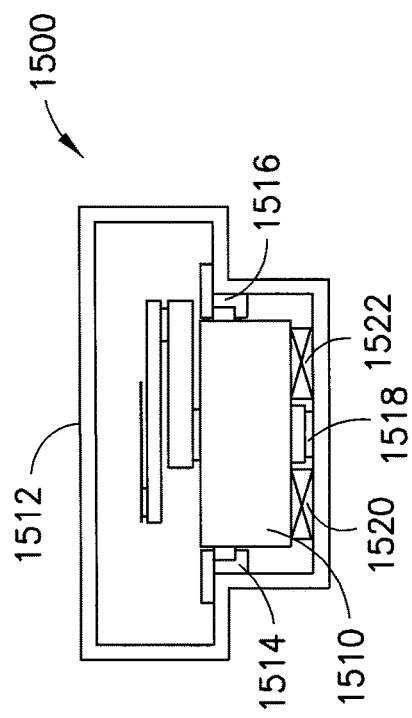
FIG. 18 is a section view of an example substrate transport platform.
Figure 17:
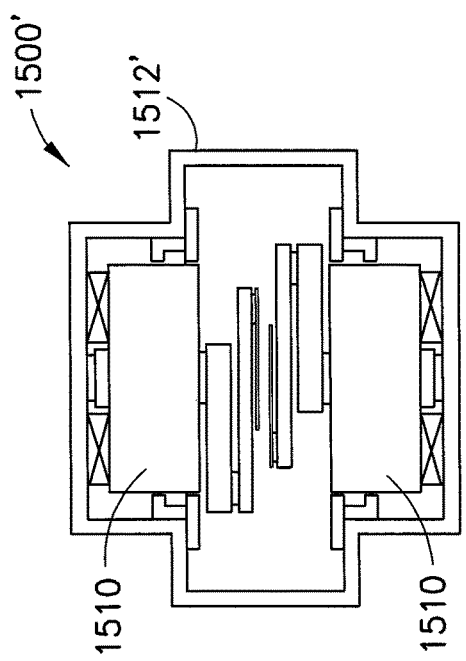
FIG. 17 is a section view of an example substrate transport platform.
Figure 19:
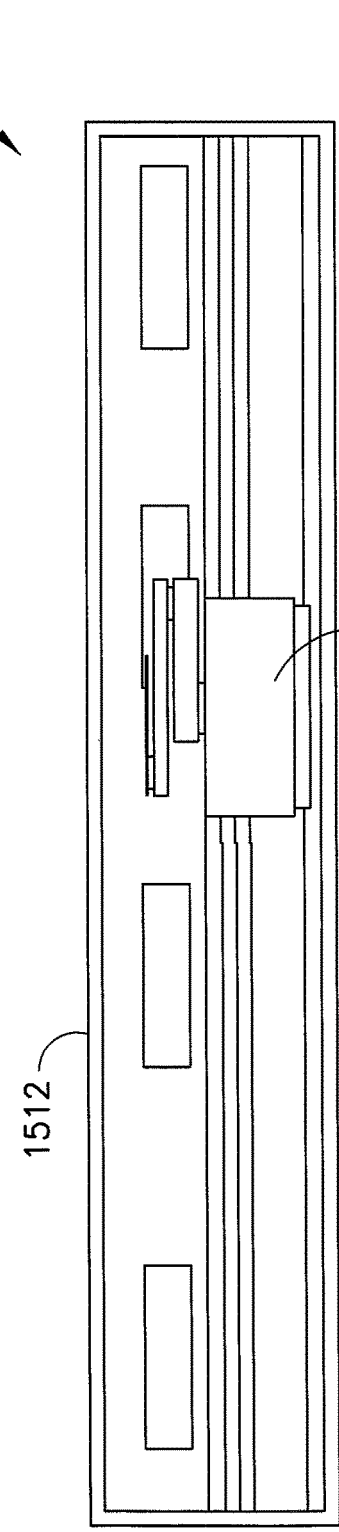
FIG. 19 is a section view of an example substrate transport platform.
Figure 22:
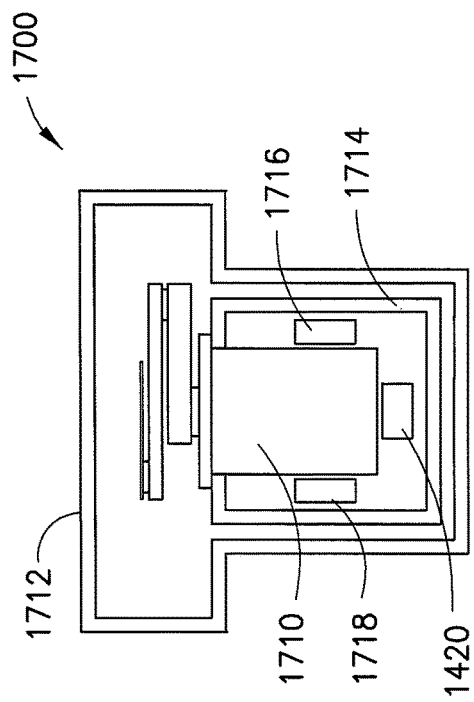
FIG. 22 is a section view of an example substrate transport platform.
Figure 23:
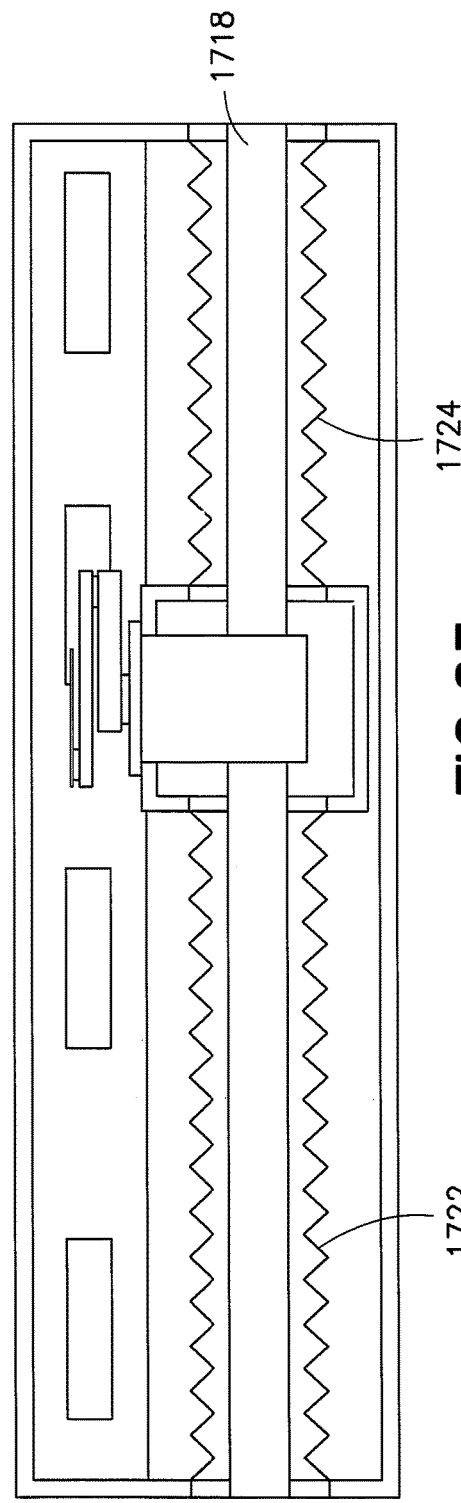
FIG. 23 is a section view of an example substrate transport platform.

Referring to FIG. 17 there is shown an end section schematic view of vacuum system 1500'. Here, system 1500 has robots 1510 in chamber 1512' that are inverted with respect to each other and as described with respect to system 1500. Referring to FIG. 18 there is shown an end section schematic view of vacuum system 1500. Referring to FIG. 19 there is shown a side section schematic view of vacuum system 1500. System 1500 has robot 1510 traversing in chamber 1512. Robot 1510 is supported on bearings 1514, 1516 and driven by motor 1518. Bearings 1514, 1516 may be conventional slides or magnetic non contact bearings. Heat is transferred by radiation from opposing surfaces 1520, 1522 of robot drive 1510 and chamber 1512. Here, the chamber side surface may be temperature controlled to ensure a maximum temperature difference is not exceeded. Power and communication may be by service loop, induction, optical wireless or otherwise be provided.

Referring to FIG. 20 there is shown an end section schematic view of vacuum system 1600. Referring to FIG. 21 there is shown a side section schematic view of vacuum system 1600. System 1600 has robot 1610 traversing in chamber 1612. Robot 1610 is supported on bearings 1614, 1616 and driven by motor 1618. Bearings 1614, 1616 may be conventional slides or magnetic non contact bearings. Heat is transferred by radiation from opposing surfaces 1620 of robot drive 1610 and chamber 1612. Here, the chamber side surface may be temperature controlled to ensure a maximum temperature difference is not exceeded. Power and communication may be by service loop, induction, optical wireless or otherwise be provided.

Referring to FIG. 24 there is shown an end section schematic view of vacuum system 1800. Referring to FIG. 25 there is shown a side section schematic view of vacuum system 1800. Here one method of traversing robot 1810 in vacuum chamber 1812 is shown. Robot 1810 may be a conventional vacuum robot enclosed within sealed enclosure 1814 and traversing on slides or supports 1816, 1818 and driven by linear motor or other suitable drive 1820. Sealed service loop 1822 is provided and as will be described in greater detail provides coolant, power and communication to robot 1810 from atmosphere with the loop sealed to the enclosure 1814 and chamber 1812 and providing an atmospheric environment surrounding robot 1810.

Figure 26:
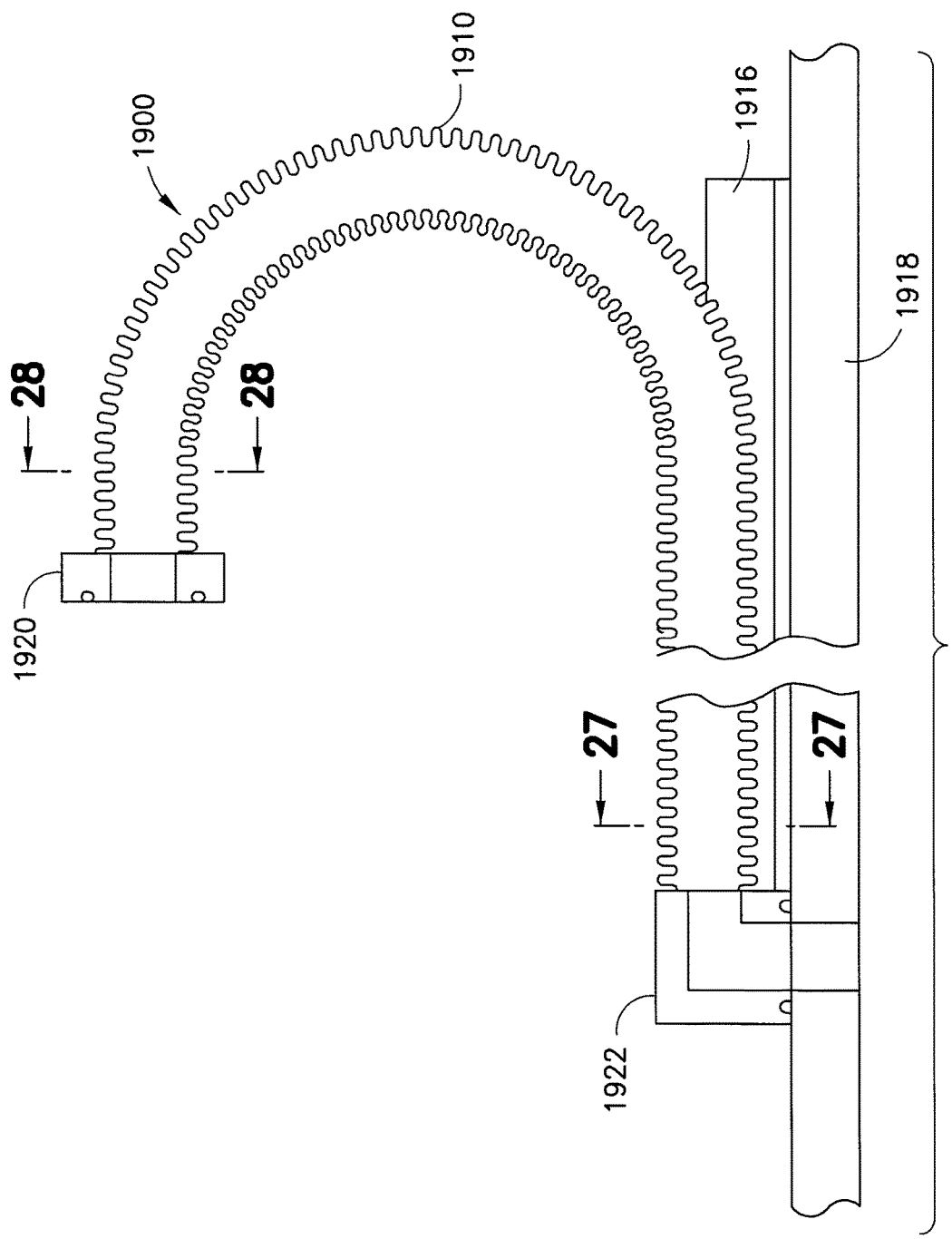
FIG. 26 is a section view of an example service loop.
Figure 27:
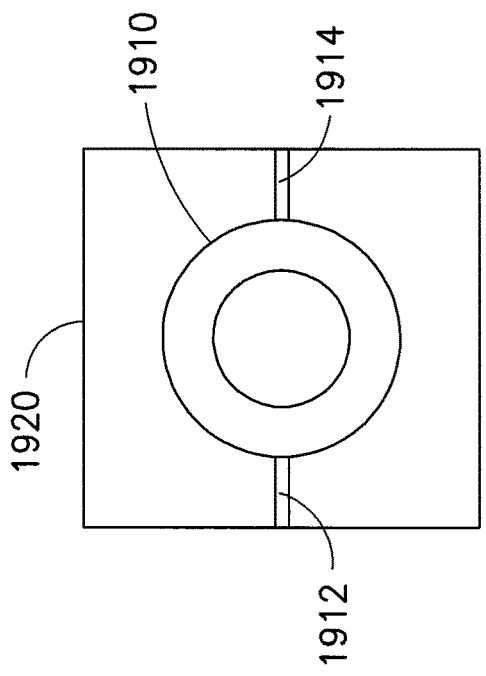
FIG. 27 is a section view of an example service loop.
Figure 28:
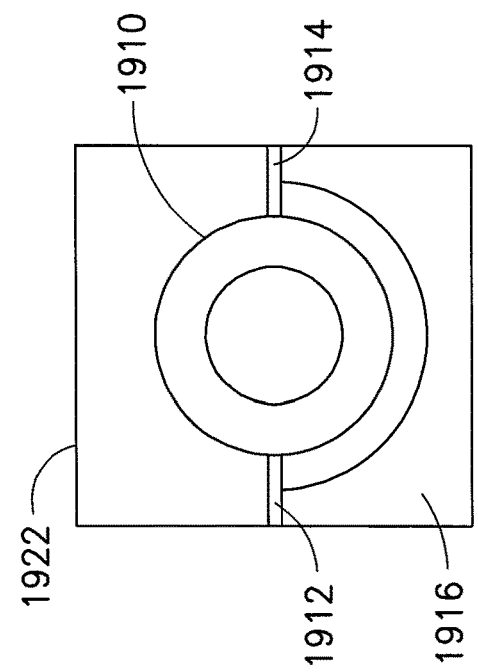
FIG. 28 is a section view of an example service loop.
Figure 29:
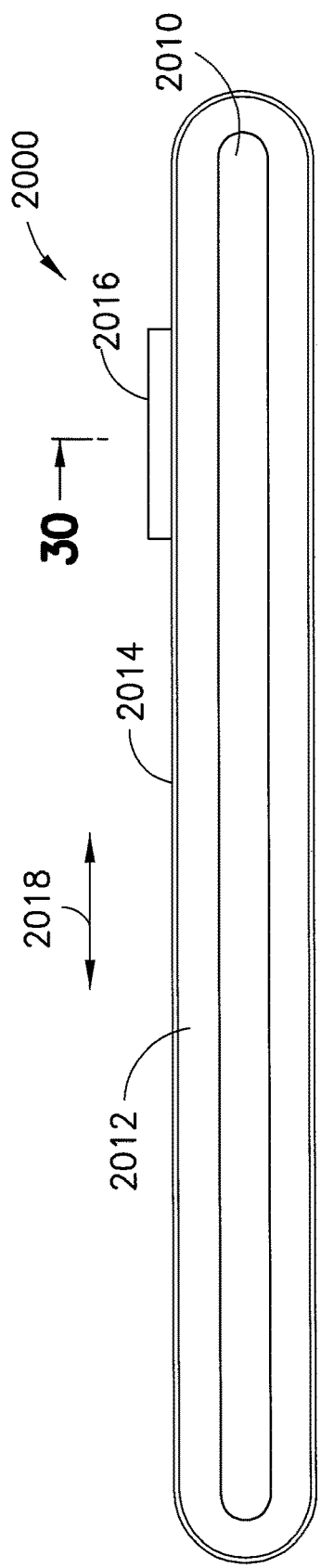
FIG. 29 is a schematic view of an example linear seal.

Referring to FIG. 26 there is shown a side schematic section view exemplary service loop 1900. Referring to FIG. 27 there is shown a schematic section view exemplary service loop 1900. Referring to FIG. 28 there is shown a schematic section view exemplary service loop 1900. Service loop 1900 has bellows 1910 which may be a formed or welded bellows. Bellows 1900 may be pre stretched and may have welded bands 1912, 1914 attached or welded to bellows 1900 preventing squirm and maintaining the shape of the loop. Support 1916 may be placed on the chamber 1918 to support the bands or flexures 1912, 1914. End 1922 is sealed to chamber 1918 where end 1920 is sealed to the robot enclosure. Here, sealed service loop 1900 provides coolant, power and communication to the robot from atmosphere with the loop sealed to the enclosure and chamber and providing an atmospheric environment surrounding robot.

Figure 30:
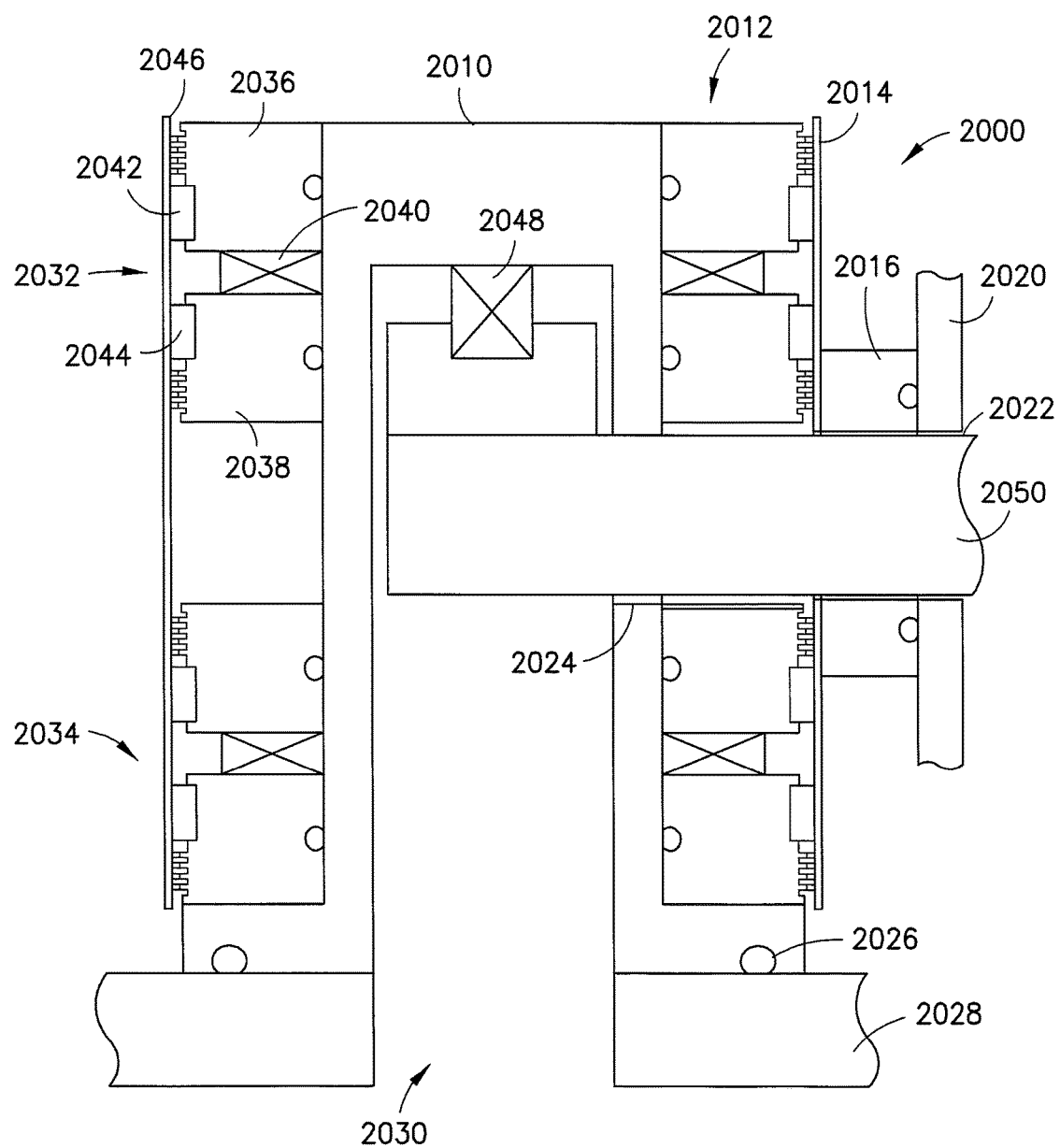
FIG. 30 is a section view of an example linear seal.
Figure 31:
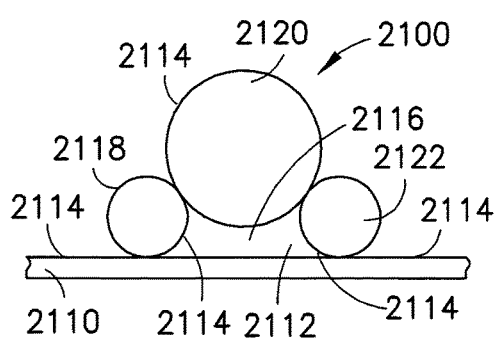
FIG. 31 is a schematic view of an example linear seal.

Referring to FIG. 30 there is shown an exemplary linear seal 2000. Seal 2000 may be used in the systems described, for example, to replace service loop(s) in vacuum. Referring to FIG. 31 there is shown an exemplary schematic cross section of linear seal 2000. Seal 2000 has housing 2010, seal portion 2012, band portion 2014 and moving interface block 2016. Block 2016 is sealed to band 2014 and may traverse 2018 the substantial length of seal 2000. Block 2016 may be coupled to vented housing, for example, a housing containing a vacuum robot where power, communication or otherwise may be provided through port 2022. Port 2022 of block 2016 traverses the length of a slot 2024 in housing 2010. Housing 2010 is sealed 2026 and coupled to the chamber 2028 along the length of a slot 2030 in chamber 2028. Housing 2010 may be made from aluminum or non magnetic material. Seal portion 2012 has upper seal 2032 and lower seal 2034, both having similar construction. Seal 2032, has first magnetic portion 2036 and second magnetic portion 238 sealed to housing 2010. Magnets 2040 are located between the first and second magnetic portions. Circulating rollers 2042 and 2044 are similarly located in race grooves on the first and second magnetic portions. A ferro fluid is located between band 2014 and staged magnetic circuits of the first and second magnetic portions. The magnets, the first and second magnetic portions, the staged magnetic circuits and band form a closed magnetic circuit with the field holding band 2014 against the rollers 2044 and opposing internal pressure. A slide 2048 and support may be provided grounded to chamber 2028 in some fashion to support a robot or other suitable load.

Figure 32:
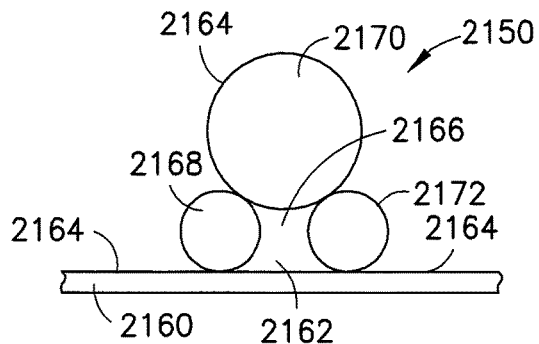
FIG. 32 is a schematic view of an example linear seal.
Figure 33:
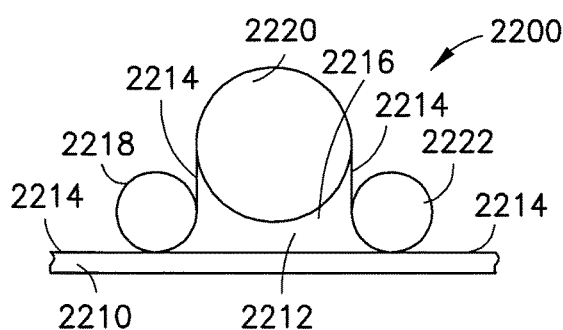
FIG. 33 is a schematic view of an example linear seal.

Referring to FIG. 31 there is shown an exemplary linear seal 2100. Seal 2100 may be used in the systems described, for example, to replace service loop(s) in vacuum. Seal 2100 has base 2110, moveable shoe 2112 and band 2114. Band 2114 is sealed to a slot in the chamber/base 2110 and also to the shoe 2112. Shoe 2112 has moving member 2116 and rolling elements 2118, 2020 and 2122. Referring to FIG. 32 there is shown an exemplary linear seal 2150. Seal 2150 may be used in the systems described, for example, to replace service loop(s) in vacuum. Seal 2150 has base 2160, moveable shoe 2162 and band 2164. Band 2164 is sealed to a slot in the chamber/base 2160 and also to the shoe 2162. Shoe 2162 has moving member 2166 and rolling elements 2168, 2070 and 2172. Referring to FIG. 33 there is shown an exemplary linear seal 2200. Seal 2200 may be used in the systems described, for example, to replace service loop(s) in vacuum. Seal 2200 has base 2210, moveable shoe 2212 and band 2214. Band 2114 is sealed to a slot in the chamber/base 2110 and also to the shoe 2112. Shoe 2112 has moving member 2116 and rolling elements 2118, 2020 and 2122.

Figure 34:
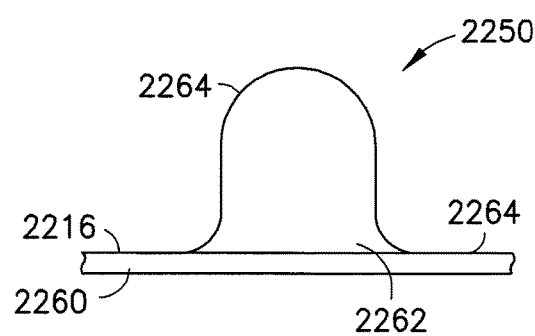
FIG. 34 is a schematic view of an example linear seal.
Figure 35:
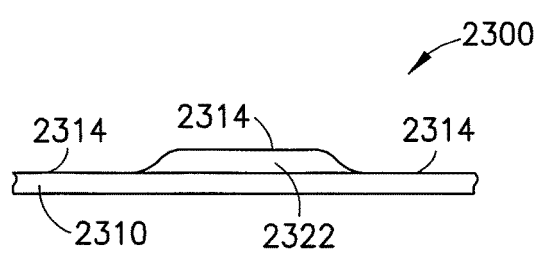
FIG. 35 is a schematic view of an example linear seal.
Figure 36:
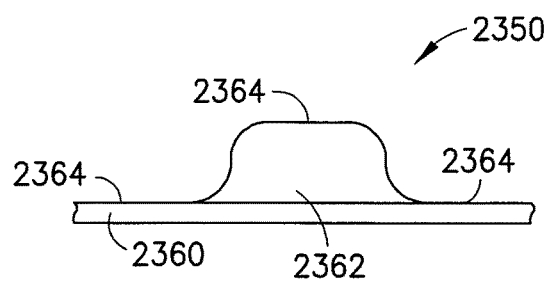
FIG. 36 is a schematic view of an example linear seal.

Referring to FIG. 34 there is shown an exemplary linear seal 2250. Seal 2250 may be used in the systems described, for example, to replace service loop(s) in vacuum. Seal 2250 has base 2260, moveable shoe 2262 and band 2264. Band 2264 is sealed to a slot in the chamber/base 2260 and also to the shoe 2262. Shoe 2262 has a moving member. Referring to FIG. 35 there is shown an exemplary linear seal 2300. Seal 2300 may be used in the systems described, for example, to replace service loop(s) in vacuum. Seal 2300 has base 2310, moveable shoe 2312 and band 2314. Band 2314 is sealed to a slot in the chamber/base 2310 and also to the shoe 2312. Shoe 2312 has a moving member. Referring to FIG. 36 there is shown an exemplary linear seal 2350. Seal 2350 may be used in the systems described, for example, to replace service loop(s) in vacuum. Seal 2350 has base 2360, moveable shoe 2362 and band 2364. Band 2364 is sealed to a slot in the chamber/base 2360 and also to the shoe 2362. Shoe 2362 has a moving member. The seals described similarly operate with a fluid seal as will be described. The band in each case may have a fixed end with the opposing end floating or spring loaded to allow for thermal expansion. Further, the ends of the seal may be provided with reservoirs should fluid migrate from one end to the other. Further wetted surfaces of seals disclosed herein may have hydrophobic or hydrophilic coatings applied as needed. In alternate aspects, contact or labyrinth based seals may be used instead of fluid based seals, for example, differentially pumped or otherwise.

Figure 37:
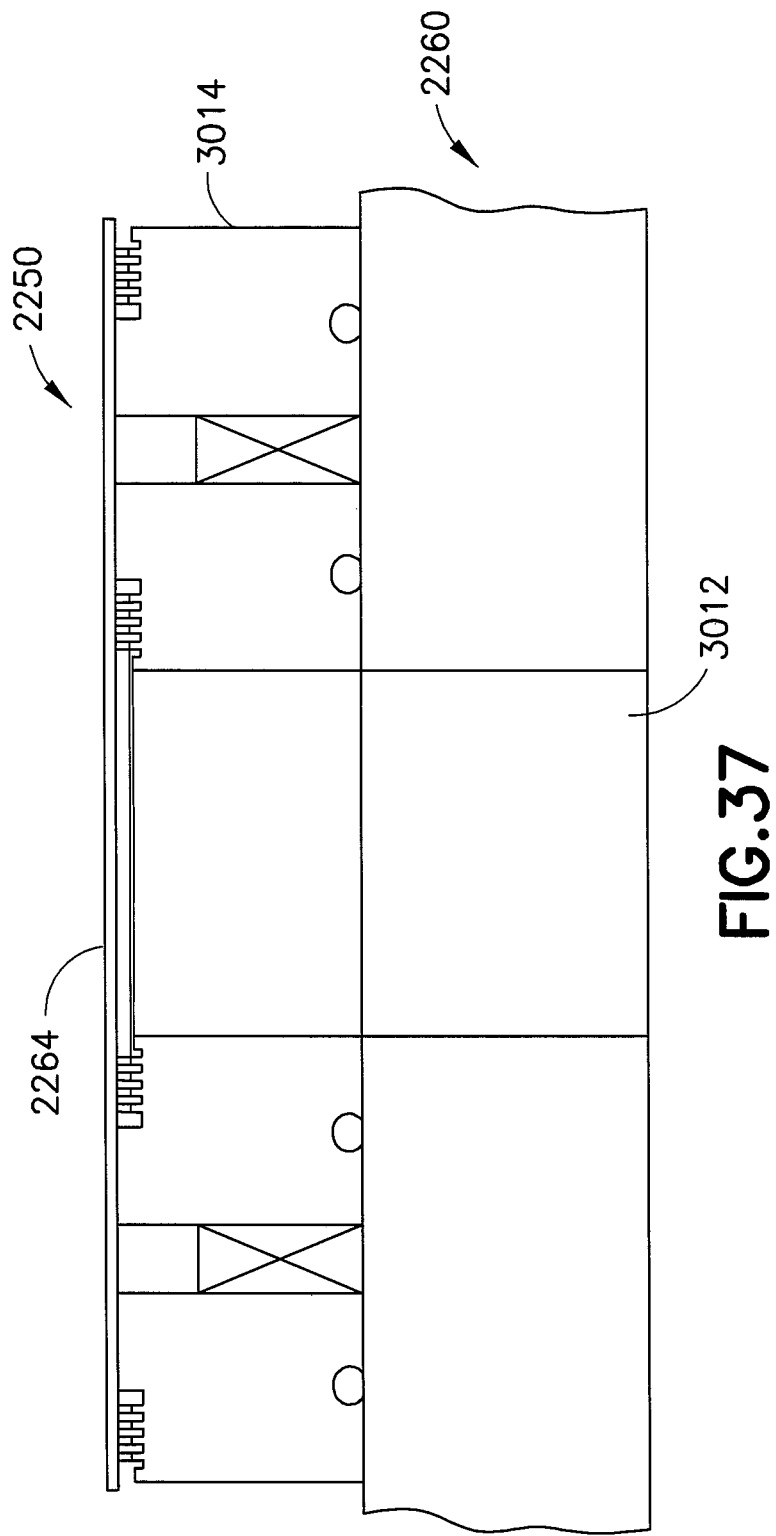
FIG. 37 is a section view of an example linear seal.
Figure 38:
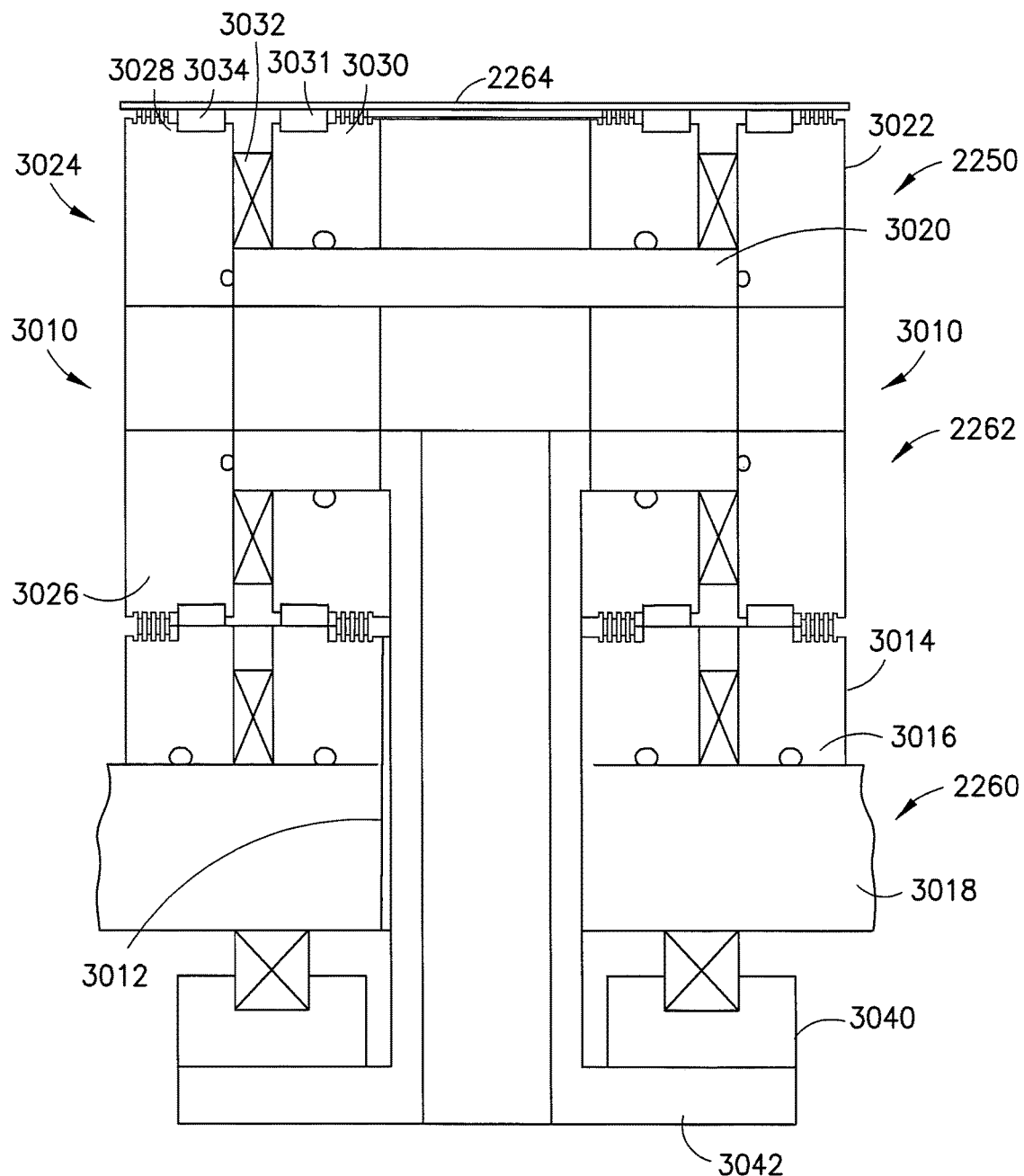
FIG. 38 is a section view of an example linear seal.
Figure 39:
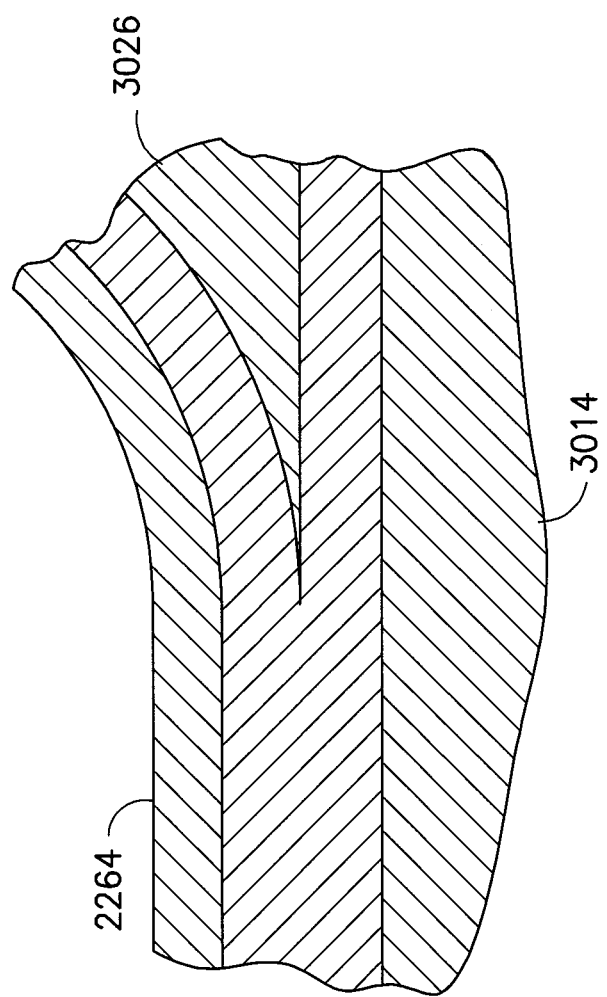
FIG. 39 is a section view of an example linear seal.

Referring to FIG. 37 there is shown an exemplary schematic cross section of linear seal 2250 when the puck or shoe is not present. Referring to FIG. 38 there is shown an exemplary schematic cross section of linear seal 2250 when the puck or shoe is present. Seal 2250 has base with seal portion 2260, band portion 2264 and moving interface block (shoe or puck) 2262. Block 2262 is sealed to band 2264 and base 2260 and may traverse the substantial length of seal 2250. Block 2262 may be coupled to vented housing, for example, a housing containing a vacuum robot where power, communication or otherwise may be provided through port 3010. Block 2262 traverses the length of a slot 3012 in base 2260. Lower seal 3014 is sealed 3016 and coupled to the chamber 3018 along the length of a slot 3012 in chamber 23018. Block 2261 has housing 3020 and seal portion 3022 where housing 3020 may be made from aluminum or non magnetic material and seal portion 3022 may be a fluid seal the shape of block 2262. Seal portion 3022 has upper seal 3024 and lower seal 3026, both having similar construction. Upper seal 3024 seals to band 2264 while lower seal 3026 seals to lower seal 3014. Seal 3024 has first magnetic portion 3028 and second magnetic portion 3030 sealed to housing 3020. Magnets 3032 are located between the first and second magnetic portions. Circulating rollers 3034, 3036 are similarly located in race grooves on the first and second magnetic portions. A ferro fluid is located between band 2264 and staged magnetic circuits of the first and second magnetic portions as seen in FIG. 39. The magnets, the first and second magnetic portions, the staged magnetic circuits and band form a closed magnetic circuit with the field holding band 2264 against the rollers 3034 and opposing internal pressure. A slide 3040 and support 3042 may be provided grounded to chamber 3018 in some fashion to support a robot or other suitable load.

Figure 40:
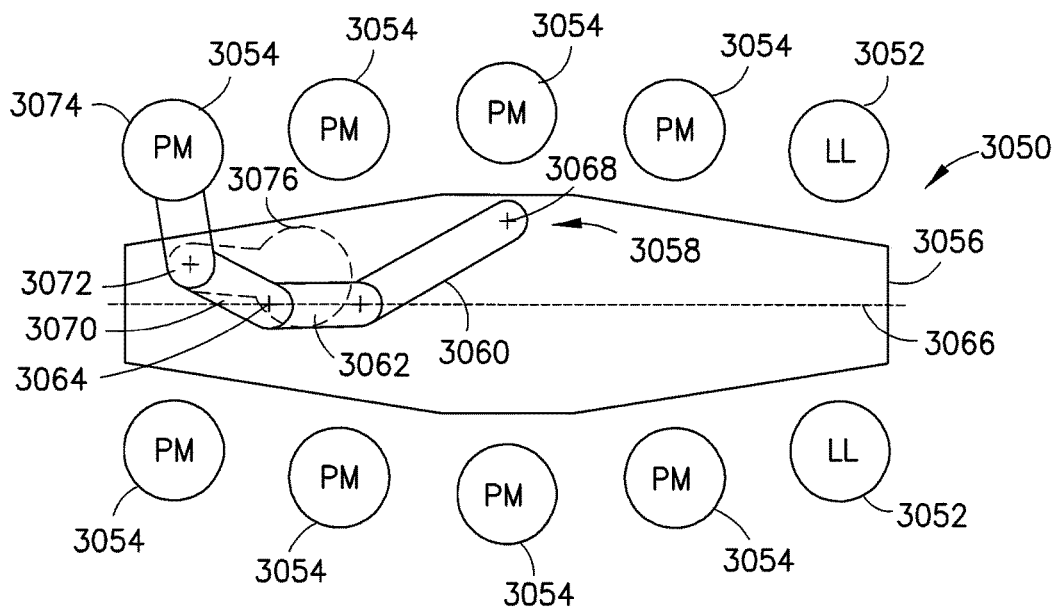
FIG. 40 is a top view of an example substrate transport platform.

Referring now to FIG. 40, there is shown a top schematic view of vacuum system 3050. System 3050 has opposing load locks 3052 and process modules 3054. Although two load locks 3052 and eight process modules 3054 are shown, any suitable number may be provided. System 3050 further has transport chamber 3056 and transport robot 3058. Transport chamber 3056 is shown having a generally linear arrangement but with reduced width at each respective end. Robot 3058 is shown having a three link arm with two end effectors mounted at the wrist of the third link such that a fast swap may be performed with the end effectors. Here, robot 3058 may have four rotary axis where the first two links 3060 and 3062 may be configured such that joint 3064 travels along a linear path 3066 with rotation of joint 3068. Here, the first two links may be unequal link length links and may employ pulleys to constrain joint 3064 along axis 3066 as disclosed in United States Patent Publication No. US2014/0205416 Published Jul. 24, 2014 and entitled ROBOT HAVING ARM WITH UNEQUAL LINK LENGTHS which is hereby incorporated by reference in its entirety. Robot 3058 further has third link 3070 and two axis wrist 3072 supporting end effectors 3074, 3076. Here, a single Z axis may be provided for a total of 5 axis for robot 3058. In alternate aspects, more or less axis or links may be provided in any suitable configuration. In the embodiment shown, the transport system may be configured such that the robot may access each process module independently where the process modules may be single, dual or otherwise. The load locks may be placed on the sides as shown or on the end of transport module 3056. In alternate aspects, the load locks may be stacked or configured otherwise. Here, the footprint of system 3050 may be optimized with chamber design such that system 3050 may be narrower than a radial arrangement.

Figure 41:
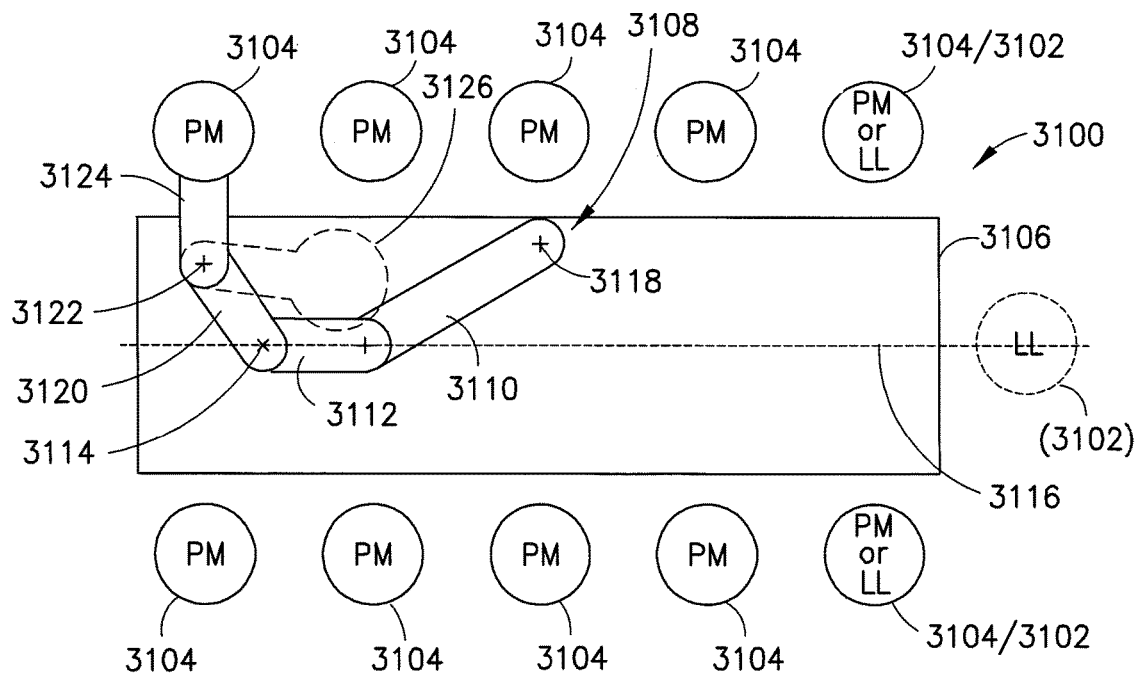
FIG. 41 is a top view of an example substrate transport platform.

Referring now to FIG. 41, there is shown a top schematic view of vacuum system 3100. System 3100 has opposing load locks 3102 and process modules 3104. Although two load locks 3102 and eight process modules 3104 are shown, any suitable number may be provided. System 3100 further has transport chamber 3106 and transport robot 3108. Transport chamber 3106 is shown having a generally linear arrangement. Robot 3108 is shown having a three link arm with two end effectors mounted at the wrist of the third link such that a fast swap may be performed with the end effectors. Here, robot 3108 may have four rotary axis where the first two links 3110 and 3112 may be configured such that joint 3114 travels along a linear path 3116 with rotation of joint 3118. Here, the first two links may be unequal link length links and may employ pulleys to constrain joint 3114 along axis 3116 as disclosed in United States Patent Publication No. US2014/0205416 Published Jul. 24, 2014 and entitled ROBOT HAVING ARM WITH UNEQUAL LINK LENGTHS which is hereby incorporated by reference in its entirety. Robot 3108 further has third link 3120 and two axis wrist 3122 supporting end effectors 3124, 3126. Here, a single Z axis may be provided for a total of 5 axis for robot 3108. In alternate aspects, more or less axis or links may be provided in any suitable configuration. In the embodiment shown, the transport system may be configured such that the robot may access each process module independently where the process modules may be single, dual or otherwise. The load locks may be placed on the sides as shown or on the end of transport module 3106. In alternate aspects, the load locks may be stacked or configured otherwise. Here, the footprint of system 3100 may be optimized with chamber design such that system 3100 may be narrower than a radial arrangement.

Figure 42:
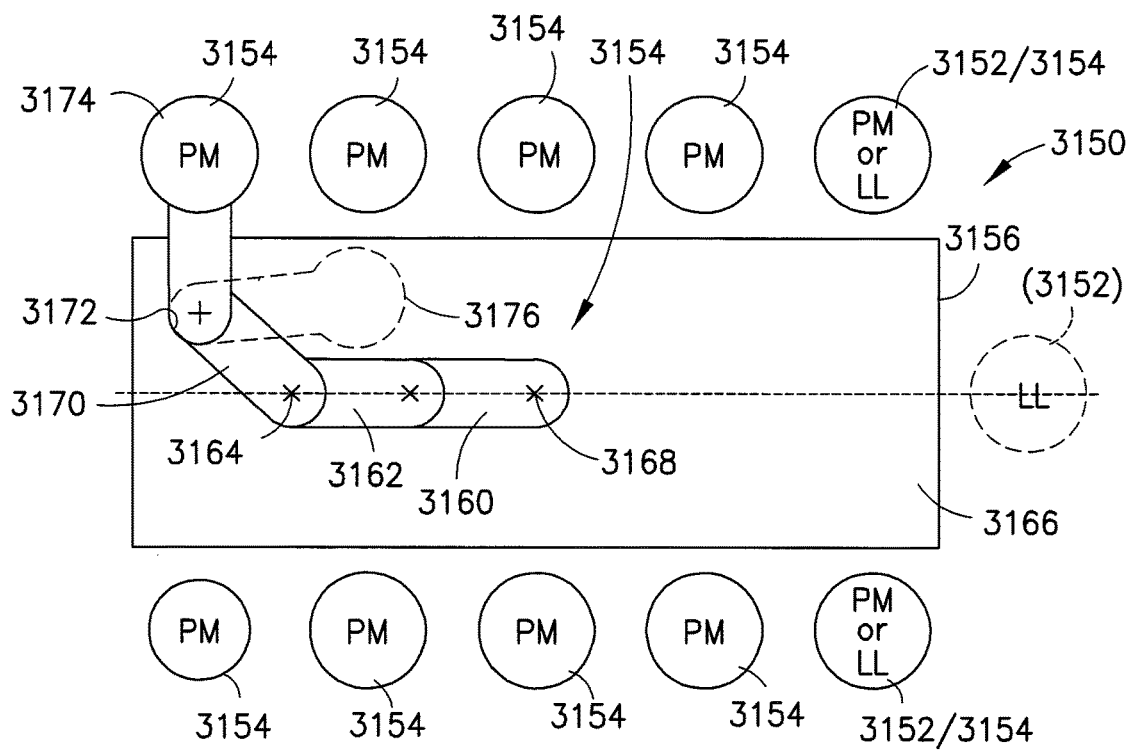
FIG. 42 is a top view of an example substrate transport platform.

Referring now to FIG. 42, there is shown a top schematic view of vacuum system 3150. System 3150 has opposing load locks 3152 and process modules 3154. Although two load locks 3152 and eight process modules 3154 are shown, any suitable number may be provided. System 3150 further has transport chamber 3156 and transport robot 3158. Transport chamber 3156 is shown having a generally linear arrangement. Robot 3158 is shown having a three link arm with two end effectors mounted at the wrist of the third link such that a fast swap may be performed with the end effectors. Here, robot 3158 may have four rotary axis where the first two links 3160 and 3162 may be configured such that joint 3064 travels along a linear path 3066 with rotation of joint 3068. Here, the first two links may be equal link length links and may employ pulleys to constrain joint 3064 along axis 3166. Robot 3158 further has third link 3170 and two axis wrist 3172 supporting end effectors 3174, 3176. Here, a single Z axis may be provided for a total of 5 axis for robot 3158. In alternate aspects, more or less axis or links may be provided in any suitable configuration. In the embodiment shown, the transport system may be configured such that the robot may access each process module independently where the process modules may be single, dual or otherwise. The load locks may be placed on the sides as shown or on the end of transport module 3156. In alternate aspects, the load locks may be stacked or configured otherwise. Here, the footprint of system 3150 may be optimized with chamber design such that system 3150 may be narrower than a radial arrangement.

Figure 43:
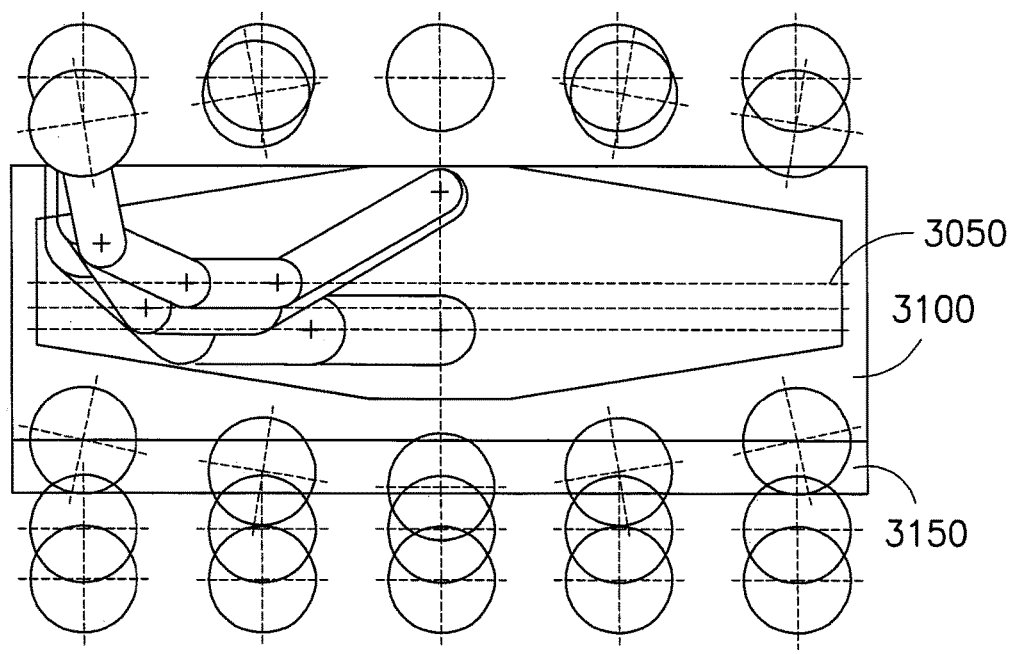
FIG. 43 is a top view of an example substrate transport platform.

Referring now to FIG. 43, there is shown a top schematic view of vacuum systems 3050, 3100 and 3150 over each other. FIG. 43 shows a footprint comparison between systems 3050, 3100 and 3150 where system 3050 is narrowest while system 31oo is wider and while system 3150 is still wider.

Figure 44:
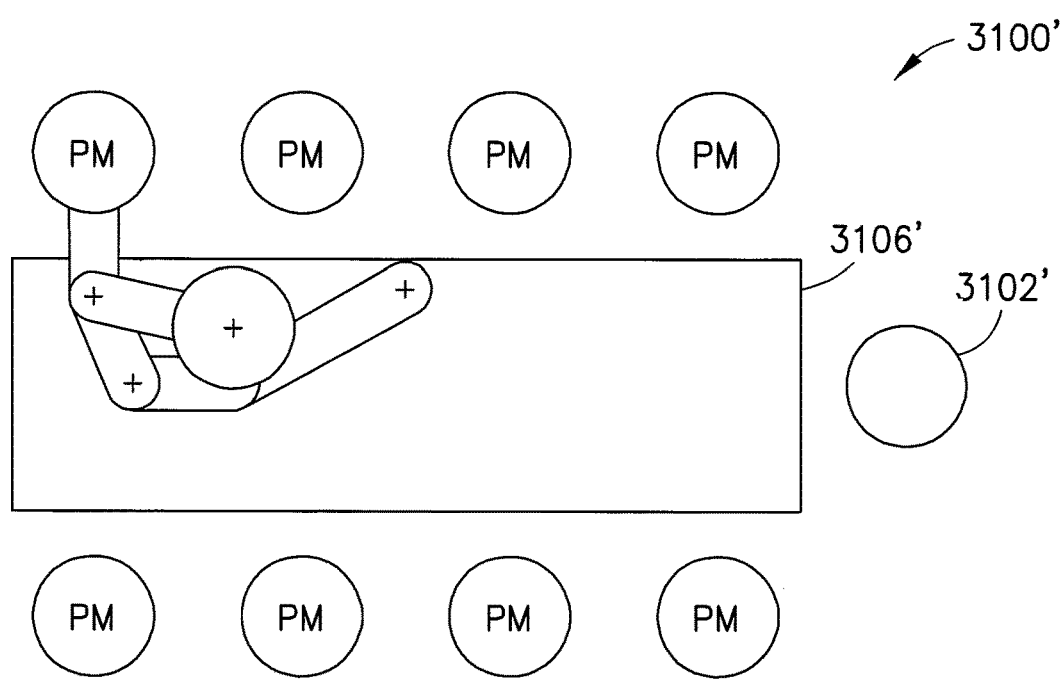
FIG. 44 is a top view of an example substrate transport platform.
Figure 45:
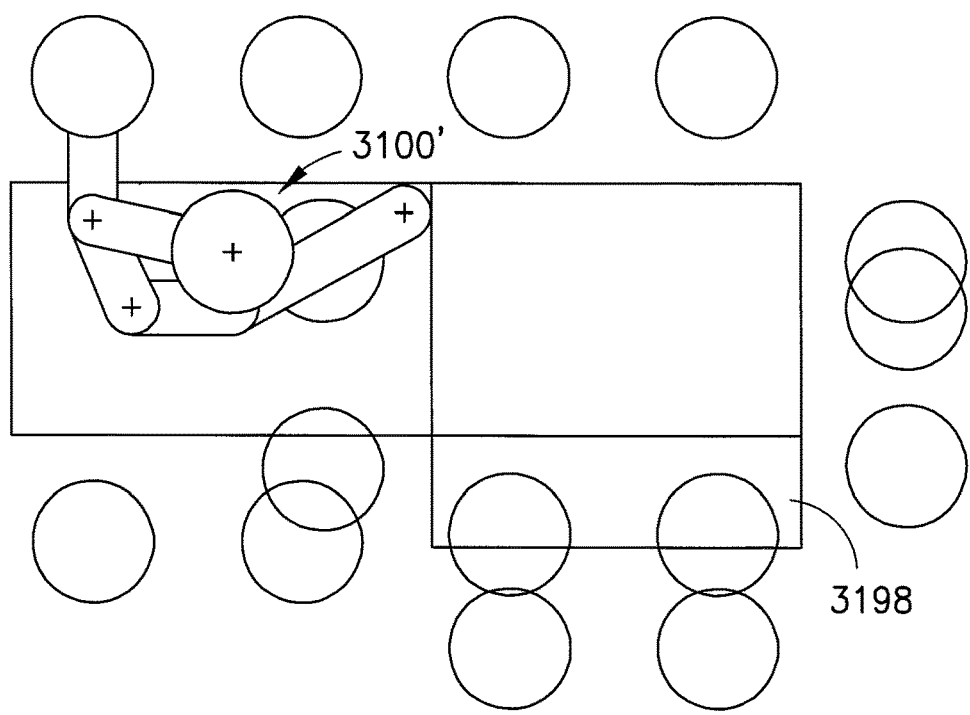
FIG. 45 is a top view of an example substrate transport platform.

Referring now to FIG. 44, there is shown a top schematic view of vacuum systems 3100'. System 3100' may have features as described with respect to system 3100 but being configured with chamber 3106' that is arranged to access 8 process modules with load lock(s) 3102' located at the end of chamber 3106'. In the embodiment, a three link arm is shown with a fast swap capable double end effector where the robot has four rotary axis. The first two links form a shuttle where the first two links may have unequal link length. The wrist may have two rotary axis where the robot may further have a single Z axis for a total of five axis. As seen in FIG. 45, system 3100' may have a narrower footprint than a traditional radial tool 3198.

Figure 46:
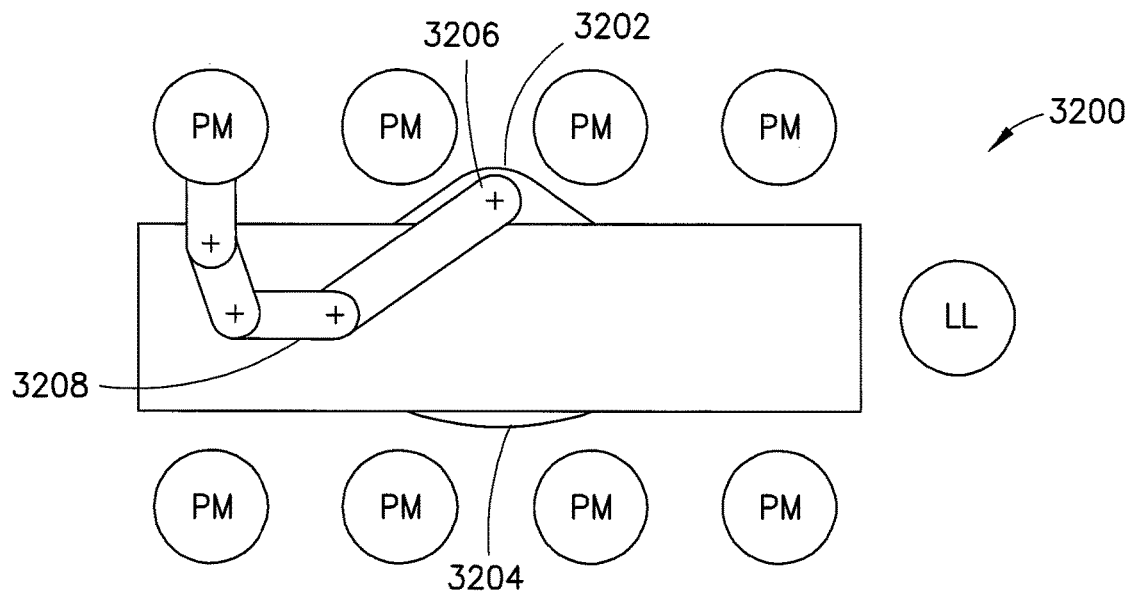
FIG. 46 is a top view of an example substrate transport platform.
Figure 47:
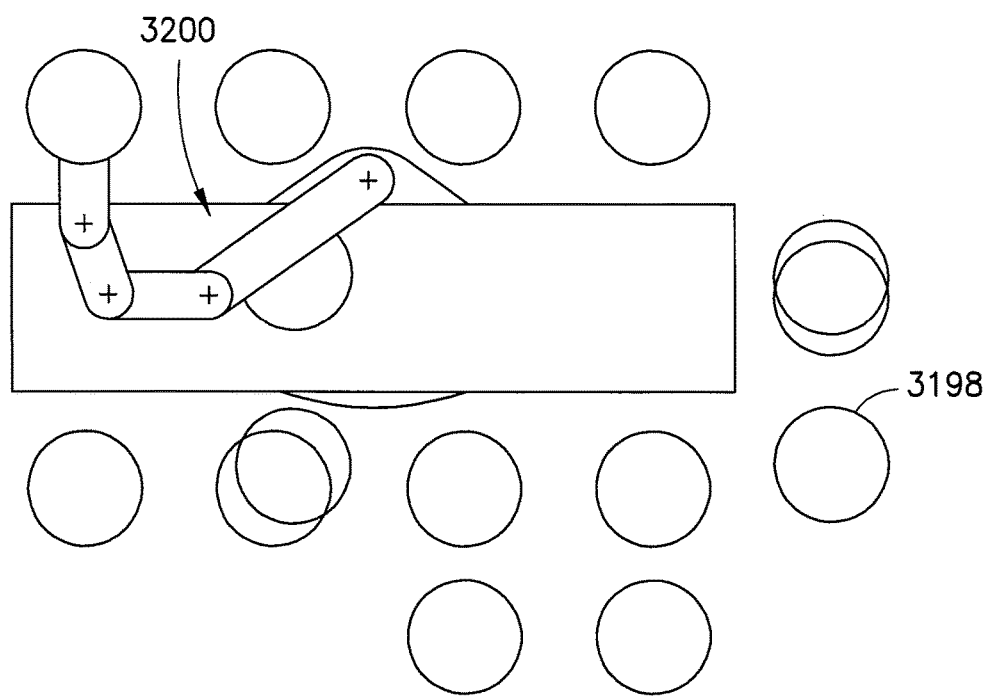
FIG. 47 is a top view of an example substrate transport platform.

Referring now to FIG. 46, there is shown a top schematic view of vacuum systems 3200. System 3200 may have features as described with respect to system 3100' but being configured chamber extensions 3202 and 3204 that allow links 3206, 3208 to extend below the process modules. Here, the robot encroaches into the isolation valve and process module zone to facilitate a narrower transport chamber between the valves. In the embodiment, a three link arm is shown with a fast swap capable double end effector where the robot has four rotary axis. The first two links form a shuttle where the first two links may have unequal link length. The wrist may have two rotary axis where the robot may further have a single Z axis for a total of five axis. As seen in FIG. 47, system 3200 may have a narrower footprint than a traditional radial tool 3198 and tool 3100' due to the extension of links 3206 and 3208 as shown.

Figure 48:
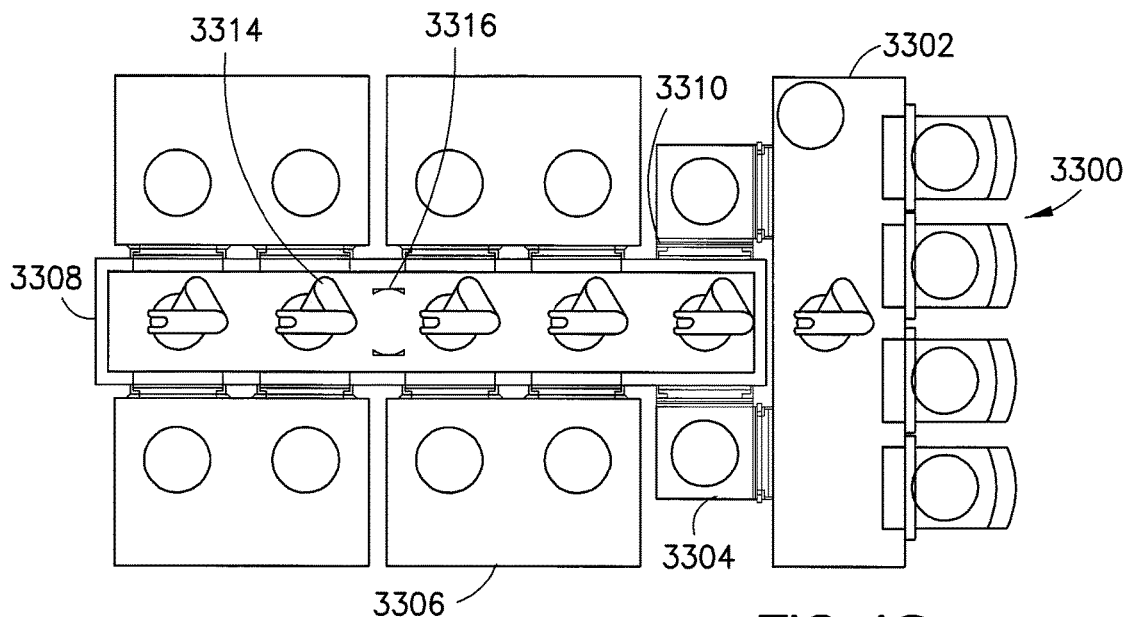
FIG. 48 is a top view of an example substrate transport platform.
Figure 49:
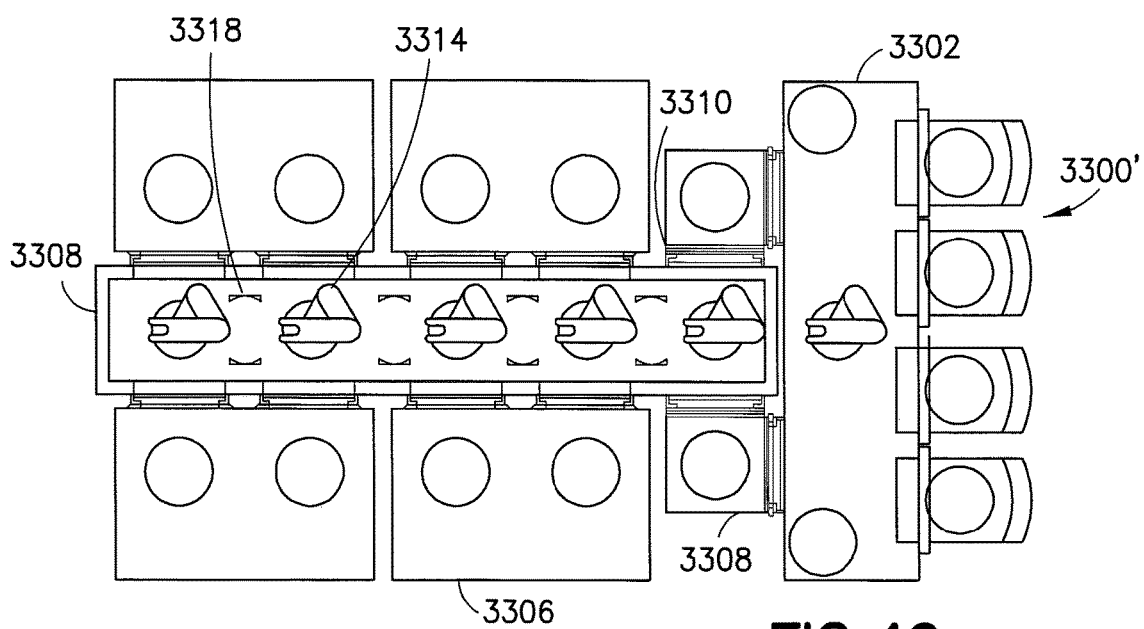
FIG. 49 is a top view of an example substrate transport platform.

Referring now to FIG. 48, there is shown a top schematic view of vacuum systems 3300. Referring also to FIG. 49, there is shown a top schematic view of vacuum systems 3300'. Systems 3300 and 3300' have EFEM 3302, opposing load locks 3304, process modules 3306 and transport module 3308 coupled by isolation valves 3310. Vacuum robots 3314 are stationed at process positions and at the load locks in a stationary manner. System 3300 has moving shuttle 3316 that the robots may pick and place wafer(s) from and to in order to facilitate substrate transport from one end of system 3300 to the other. System 3300' has stationary buffers 3318 that the robots may pick and place wafer(s) from and to in order to facilitate substrate transport from one end of system 3300' to the other.

Figure 50:
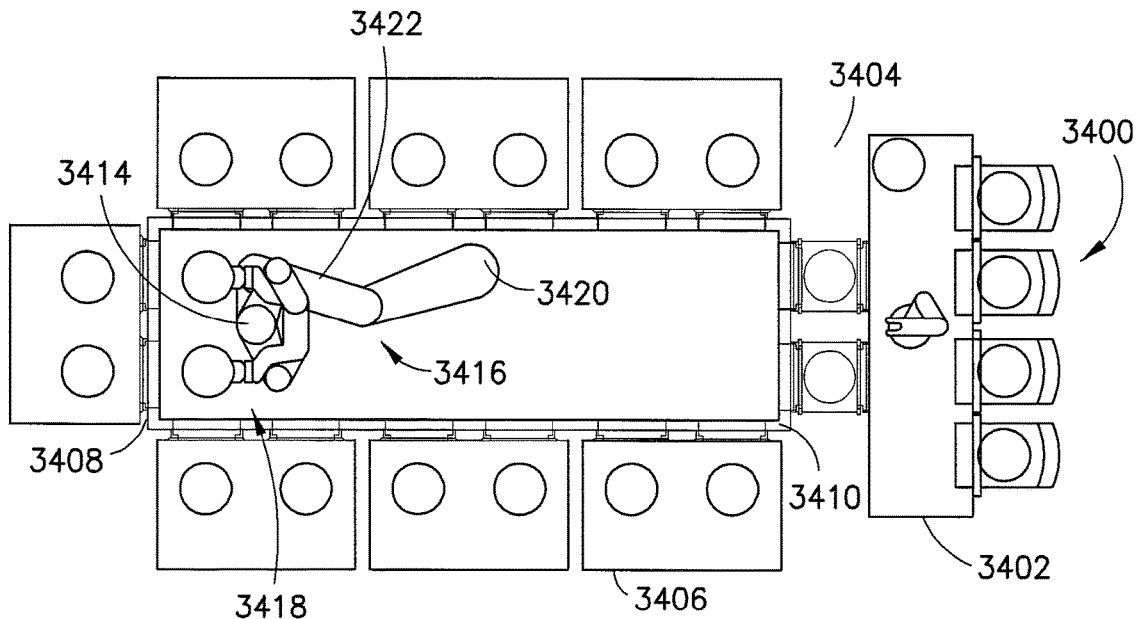
FIG. 50 is a top view of an example substrate transport platform.
Figure 51:
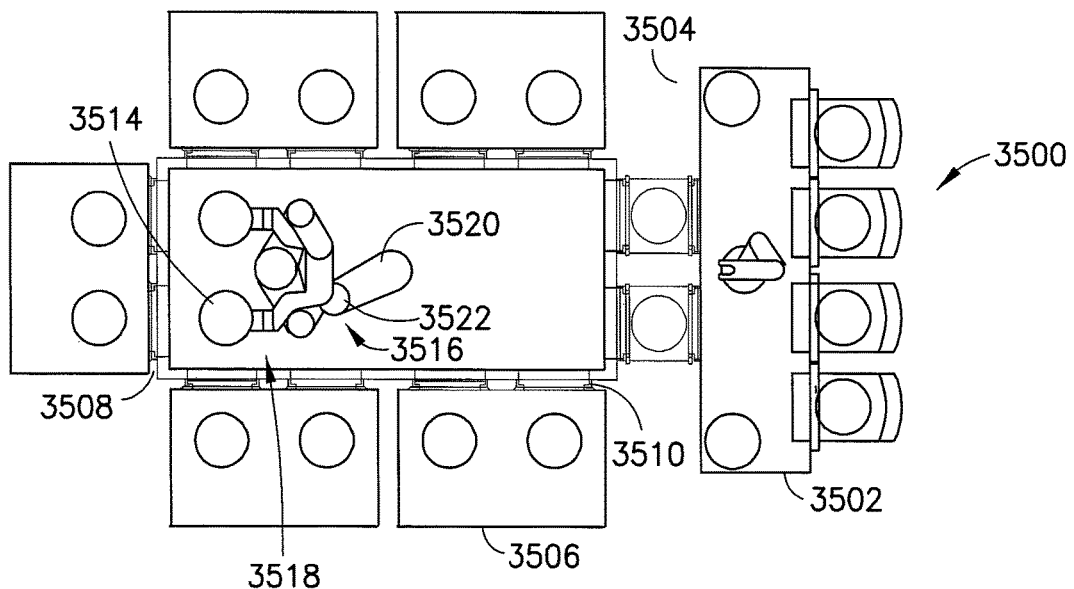
FIG. 51 is a top view of an example substrate transport platform.
Figure 52:
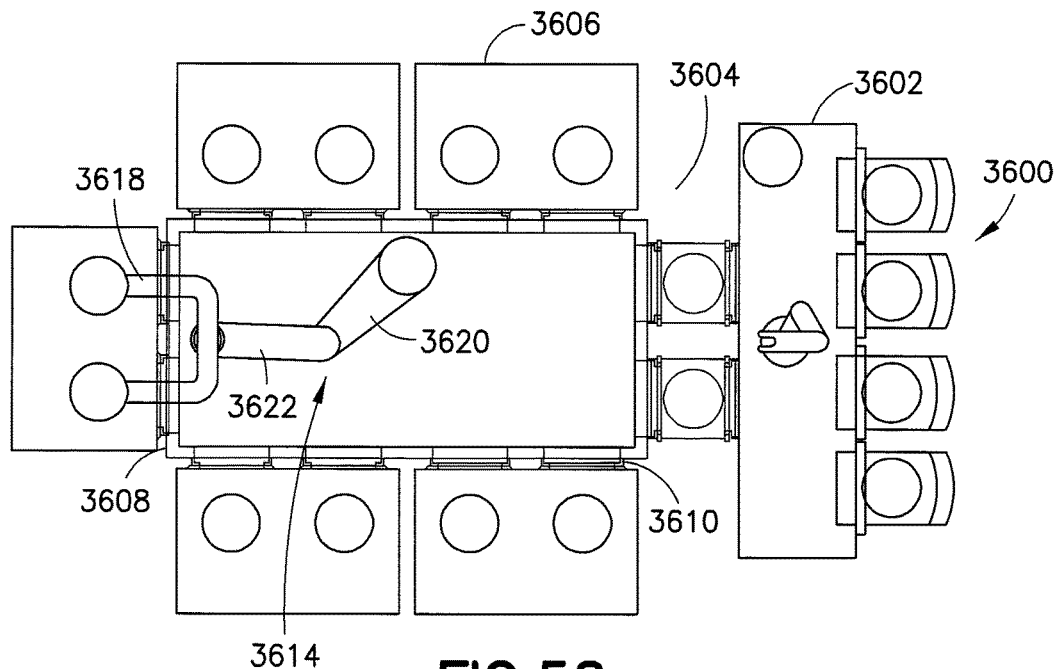
FIG. 52 is a top view of an example substrate transport platform.
Figure 53:
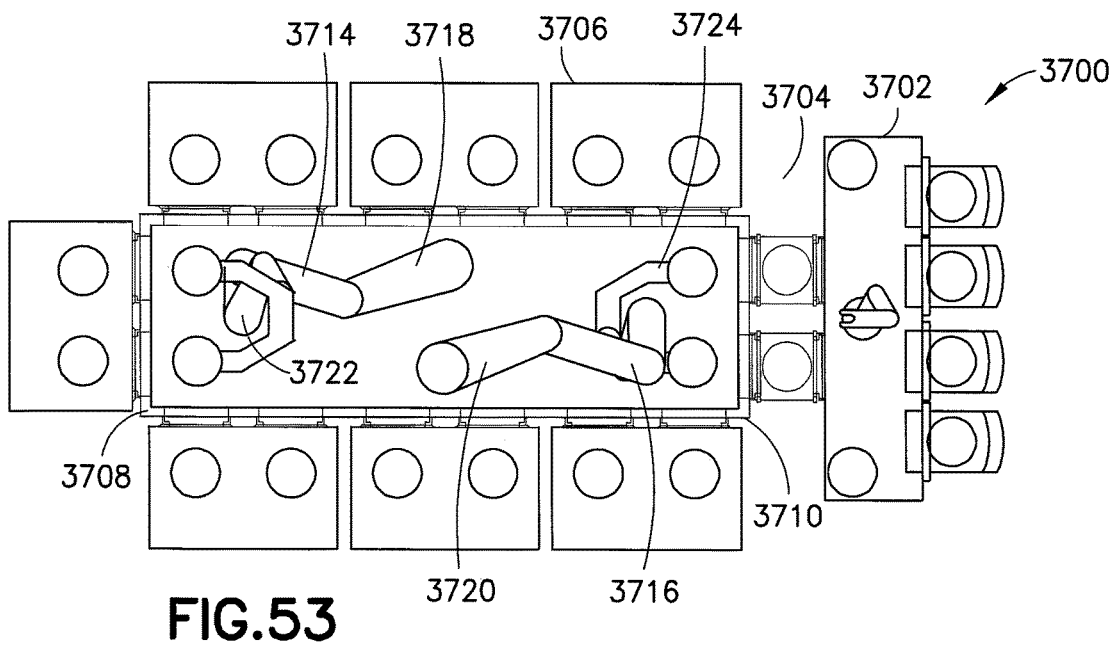
FIG. 53 is a top view of an example substrate transport platform.
Figure 54:
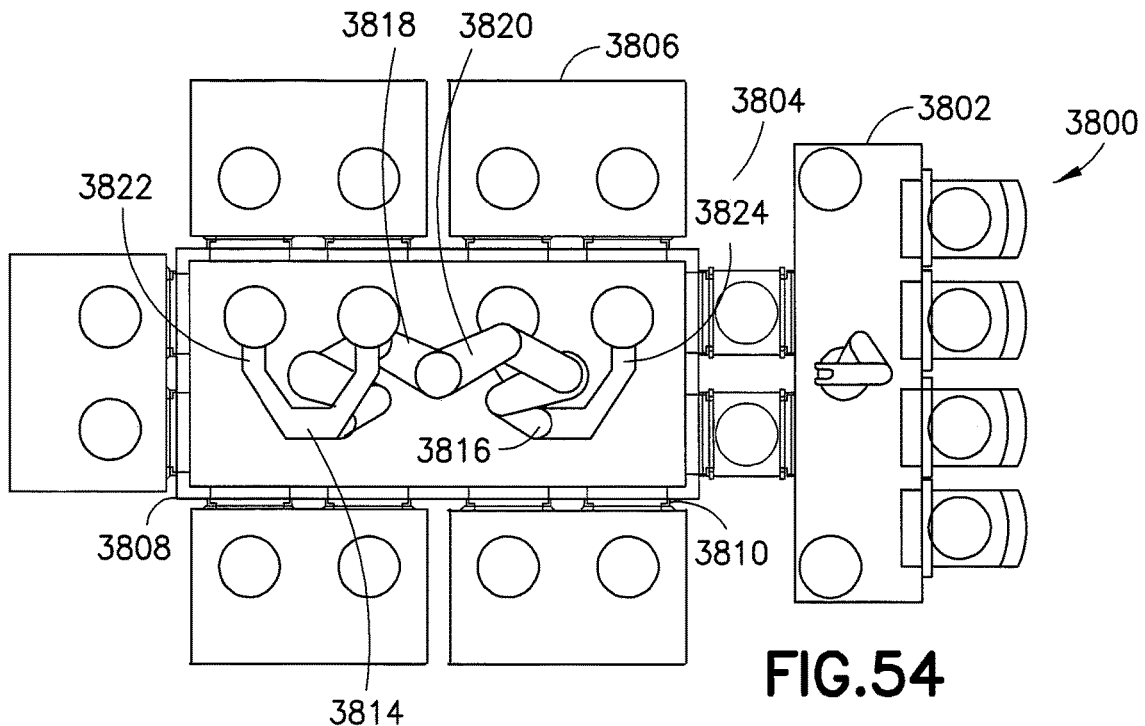
FIG. 54 is a top view of an example substrate transport platform.
Figure 55:
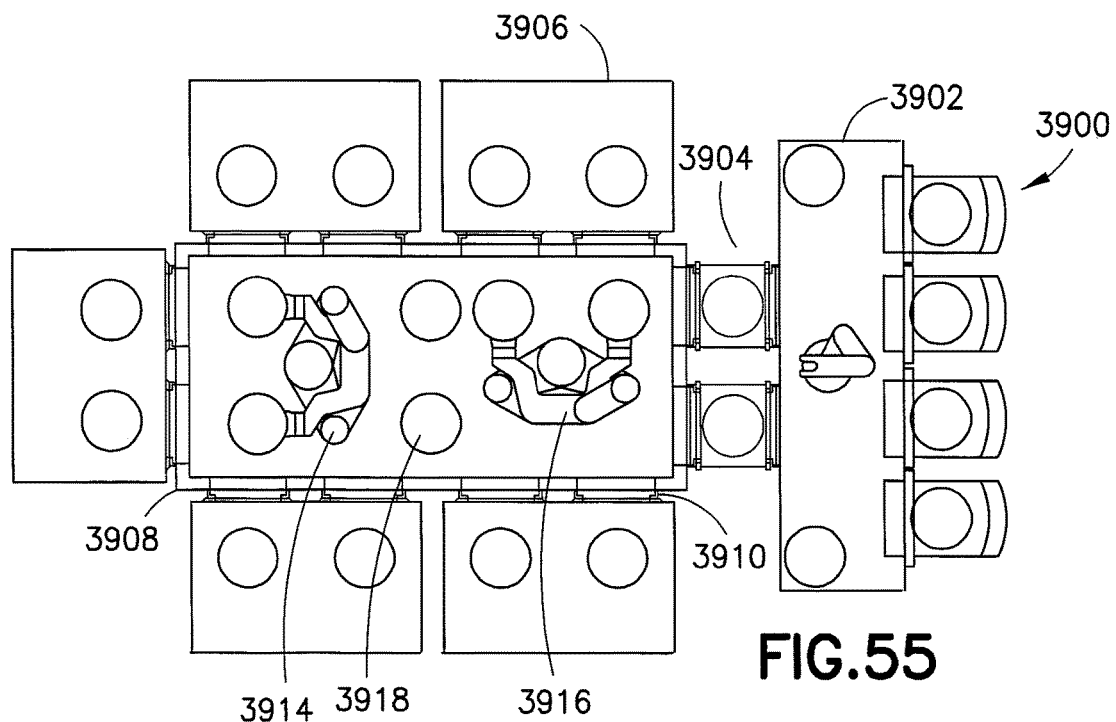
FIG. 55 is a top view of an example substrate transport platform.

Referring now to FIG. 50, there is shown a top schematic view of vacuum systems 3400. System 3400 has EFEM 3402, load locks 3404, seven twin process modules 3406 and transport module 3408 coupled by isolation valves 3410. It is noted that an EFEM (Equipment Front End Module) may be provided on any of the disclosed examples where the EFEM may be utilized to transport substrates to and from the load lock(s) via isolation valves on the load lock(s) to and from substrate carriers, for example, FOUP's (Front Opening Unified Pods). Vacuum robot 3414 has a moving two link shuttle 3416 that moves arms 3418 along a linear path. The moving two link shuttle 3416 is shown with equal length links 3420, 3422 offset to one of the sides in chamber 3408. Alternately, unequal link lengths may be provided, for example, where a shoulder link rotates about a fixed axis with respect to chamber 3408 and where a wrist axis travels along a linear path offset from the shoulder axis. Here, with equal link lengths, the wrist of the two link shuttle 3416 is offset form a center of rotation of robot arm 3414 where the wrist of the two link shuttle 3416 moves along a linear path allowing arms 3414 to selectively access process modules 3406 and/or load locks 3404. Robot arm 3414 may be provided with two linkages that allow robot 3414 to sequentially pick processed substrates from process module 3406 and place unprocessed substrates in process module 3406. In this manner, the substrates may be exchanged while minimizing the time that the process module is out of service for the exchange. Similarly, the fast exchange aspect of robot 3414 may be provided where either single or tandem process modules are provided. Similarly, the fast exchange aspect of robot 3414 may be provided in any of the disclosed examples in any suitable combination. Although seven tandem process modules are shown, more or less single or tandem process modules may be provided. Referring also to FIG. 51, there is shown a top schematic view of vacuum systems 3500. System 3500 has EFEM 3502, load locks 3504, five twin process modules 3506 and transport module 3508 coupled by isolation valves 3510. Vacuum robot 3514 has a moving two link shuttle 3516 that moves arms 3518 along a linear path. The moving two link shuttle 3516 is shown with equal length links 3520, 3522 centered in chamber 3508. Alternately, unequal link lengths may be provided. Referring also to FIG. 52, there is shown a top schematic view of vacuum systems 3600. System 3600 has EFEM 3602, load locks 3604, five twin process modules 3606 and transport module 3608 coupled by isolation valves 3610. Vacuum robot 3614 has a two link arm that moves end effector 3618 to transport substrates. The two link arm is shown with equal length links 3620, 3622 offset in chamber 3608. Alternately, unequal link lengths may be provided. Referring also to FIG. 53, there is shown a top schematic view of vacuum systems 3700. System 3700 has EFEM 3702, load locks 3704, seven twin process modules 3706 and transport module 3708 coupled by isolation valves 3710. Vacuum robots 3714, 3716 have moving two link shuttles 3718, 3720 that move arms 3722, 3724 along a linear path. The moving two link shuttles are shown with equal length links offset in chamber 3708. Alternately, unequal link lengths may be provided. In the embodiment shown, robot 3714 is mounted to the bottom of chamber 3708 while robot 3716 is mounted to the top of chamber 3708 inverted with respect to robot 3714. Referring also to FIG. 54, there is shown a top schematic view of vacuum systems 3800. System 3800 has EFEM 3802, load locks 3804, five twin process modules 3806 and transport module 3808 coupled by isolation valves 3810. Vacuum robots 3814, 3816 have moving two link shuttles 3818, 3820 that move arms 3822, 3824 along a linear path. The moving two link shuttles are shown with equal length links centered in chamber 3808. Alternately, unequal link lengths may be provided. In the embodiment shown, robot 3814 is mounted to the bottom of chamber 3808 while robot 3816 is mounted to the top of chamber 3808 inverted with respect to robot 3814. Referring also to FIG. 55, there is shown a top schematic view of vacuum systems 3900. System 3900 has EFEM 3902, load locks 3904, five twin process modules 3906 and transport module 3908 coupled by isolation valves 3910. Vacuum robots 3914, 3916 are stationarily mounted to chamber 3908 with twin buffer 3918 mounted between them to facilitate substrate transport between robots 3914, 3916.

In accordance with one example embodiment, a transport apparatus comprises a robot drive; an arm having a first end connected to the robot drive; and at least one end effector connected to a second end of the arm, where the arm comprises at least three links connected in series to form the arm, and where the arm is configured to be moved by the robot drive to move the at least one end effector among load locks and two or more sets of opposing process modules.

The at least three links may comprise four or more of the links connected in series. The at least one end effector may comprise at least two of the end effectors connected to the second end of the arm. The transport apparatus may be configured to substantially simultaneously move the at least two end effectors into respective opposing ones of the process modules. The at, least two end effectors may each be connected to the arm to be independently rotatable relative to each other. The robot drive and the first end of the arm may be connected to a traverser, where the traverser is configured to linearly moved the robot drive and the arm in a horizontal path. The at least three links may be independently rotatable relative to each other by the robot drive, or non-independently rotatable relative to each other by movement constraining connections between joints of the links.

In accordance with one example method, the method may comprise connecting a first end of an arm to a robot drive, where the arm comprises at least three links connected in series to form the arm, and connecting at least one end effector to a second end of the arm, where the arm is configured to be moved by a robot drive to move the at least one end effector among load locks and two or more sets of opposing process modules.

In accordance with one example embodiment an apparatus is provided comprising at least one processor; and at least one non-transitory memory including computer program code, where the at least one memory and the computer program code are configured, with the at least one processor, to cause the apparatus to move an arm, where the arm has a first end connected to a robot drive; and at least one end effector connected to a second end of the arm, where the arm comprises at least three links connected in series to form the arm, and where the arm is moved by the robot drive to move the at least one end effector among load locks and two or more sets of opposing process modules.

In one example embodiment a vacuum transport system may be provided comprising a transport chamber; the transport apparatus connected to the transport chamber, where the transport apparatus forms a first transport apparatus of the vacuum transport system; and a second transport apparatus connected to the transport chamber, where the second transport apparatus comprises a second robot drive; a second arm having a first end connected to the second robot drive; and at least one second end effector connected to a second end of the second arm, where the second arm comprises at least three second links connected in series to form the second arm, and where the second arm is configured to be moved by the second robot drive to move the at least one end second effector among two or more sets of opposing process modules, where the first and second transport apparatus are configured to deliver one or more devices to be processed therebetween.

An example embodiment may be provided in a transport apparatus comprising a robot drive; an arm having a first end connected to the robot drive; and at least two end effectors connected to a second end of the arm, where the robot drive and the arm are configured to move the at least two end effectors into and/or out of at least two opposing process modules at substantially a same time.

The arm may comprise at least three links connected in series to form the arm, and where the at least two end effectors are each connected to the arm to be independently rotatable relative to each other. The at least three links may comprise four or more of the links connected in series. The at least three links may be independently rotatable relative to each other by the robot drive, and/or non-independently rotatable relative to each other by movement constraining connections between joints of the links. A first one of the end effectors may be connected to the second end of the arm by a first independent rotary link, and where a second one of the end effectors is connected to the second end of the arm by a second independent rotary link. The robot drive and the first end of the arm may be connected to a traverser, where the traverser is configured to linearly moved the robot drive and the arm in a horizontal path.

An example method may comprise moving a robot arm by a robot drive to move at least two end effectors, connected to an end of the arm, into and/or out of at least two opposing process modules at substantially a same time.

An example apparatus may comprise at least one processor; and at least one non-transitory memory including computer program code, the at least one memory and the computer program code configured to, with the at least one processor, cause the apparatus to move at least two end effectors, connected to a same end of a robot arm, into and/or out of at least two opposing process modules at substantially a same time.

An example embodiment may be provided in a vacuum transport system comprising a transport chamber; a first transport apparatus connected to the transport chamber, where the first transport apparatus comprises a first robot drive, a first arm connected to the first robot drive, and at least one first end effector connected to the first arm, where the at least one end first effector is configured to support at least two devices to be processed thereon; and a second transport apparatus connected to the transport chamber, where the second transport apparatus comprises a second robot drive, a second arm connected to the second robot drive, and at least one second end effector connected to the second arm, where the at least one second end effector is configured to support at least two devices to be processed thereon, where the first and second transport apparatus are configured move the devices to be processed directly between the first and second transport apparatus.

At least one of the first and second arm may comprise at least three links connected in series to form the first and/or second arm, where the first arm is configured to be moved by the first robot drive to move the at least one first end effector among load locks and two or more sets of opposing process modules. The first transport apparatus may be configured to substantially simultaneously move two of the first end effectors into respective opposing ones of the process modules.

An example method may comprise moving one or more devices to be processed from a first end effector on a first robot arm to a second end effector on a second robot arm inside a vacuum transport chamber.

An example apparatus may comprise at least one processor; and at least one non-transitory memory including computer program code, the at least one memory and the computer program code configured, with the at least one processor, to cause the apparatus to move one or more devices to be processed from a first end effector on a first robot arm to a second end effector on a second robot arm inside a vacuum transport chamber.

It should be seen that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
   a substrate transport chamber configured to have process modules and at least one load lock connected thereto, where the substrate transport chamber has a general elongate length extending along a centerline of the substrate transport chamber and a narrower width;
   a robot drive connected to the substrate transport chamber, where the robot drive is mounted to the substrate transport chamber at a singular fixed location on the substrate transport chamber, where the location is offset from the centerline of the substrate transport chamber;
   a robot arm having a first end connected to the robot drive, where the robot arm comprises at least three links connected in series; and
   at least one end effector connected to a second end of the robot arm.

2. An apparatus as in claim 1 where the at least one end effector comprises two end effectors connected to the second end of the robot arm, where the two end effectors are rotatable on the second end of the robot arm.

3. An apparatus as in claim 1 where the robot drive comprises coaxial drive shafts at the singular fixed location, and where the robot drive is configured to move the robot arm in a vertical direction by moving the coaxial drive shafts up and down.

4. An apparatus as in claim 1 where first and second ones of the links are located below a horizontal plane along a bottom of the process modules.

5. An apparatus as in claim 1 where the substrate transport chamber comprises a chamber extension configured to be located at least partially between adjacent ones of the process modules, where the fixed singular location is located, at least partially, at the chamber extension.

6. An apparatus as in claim 1 where the robot drive is configured to be retained at the fixed singular location on the substrate transport chamber while the robot arm is moved by the robot drive to move the at least one end effector among the at least one load lock and two or more sets of opposing ones of the process modules.

7. An apparatus comprising:
a substrate transport chamber configured to have process modules and at least one load lock connected thereto, where the substrate transport chamber has a general elongate length extending along a centerline of the substrate transport chamber and a narrower width;
a robot drive connected to the substrate transport chamber, where the robot drive is located at a singular fixed location on the substrate transport chamber which is offset from the centerline of the substrate transport chamber;
a robot arm having a first end connected to the robot drive, where the robot arm comprises at least three links connected in series; and
at least one end effector connected to a second end of the robot arm,
where the robot drive comprises coaxial drive shafts at the singular fixed location, where the robot arm forms four axes of rotation including a first axis of rotation at the coaxial drive shafts, a second axis of rotation between a first one of the links and a second one of the links, a third axis of rotation between the second link and a third one of the links, a fourth axis of rotation between the third link and that at least one end effector.

8. An apparatus as in claim 7 where the apparatus is configured to constrain movement of the third axis of rotation to the centerline of the substrate transport chamber.

9. An apparatus as in claim 7 where the apparatus is configured to constrain movement of the third axis of rotation to a path parallel to the centerline of the substrate transport chamber.

10. A method comprising:
providing a substrate transport chamber configured to have process modules and at least one load lock connected thereto, where the substrate transport chamber has a general elongate length extending along a centerline of the substrate transport chamber and a narrower width;
connecting a robot drive to the substrate transport chamber, where the robot drive is mounted to the substrate transport chamber at a singular fixed location on the substrate transport chamber, where the location is offset from the centerline of the substrate transport chamber;
connecting a robot arm to the robot drive, where a first end of the robot arm is connected to the robot drive, and where the robot arm comprises at least three links connected in series; and
connecting at least one end effector to a second end of the robot arm.

11. A method as in claim 10 where the at least one end effector comprises two end effectors connected to the second end of the robot arm, where the two end effectors are rotatable on the second end of the robot arm.

12. A method as in claim 10 where the robot drive comprises coaxial drive shafts at the singular fixed location, where the robot arm forms four axes of rotation including a first axis of rotation at the coaxial drive shafts, a second axis of rotation between a first one of the links and a second one of the links, a third axis of rotation between the second link and a third one of the links, a fourth axis of rotation between the third link and that at least one end effector.

13. A method as in claim 12 comprising constraining movement of the third axis of rotation to the centerline of the substrate transport chamber.

14. A method as in claim 12 comprising constraining movement of the third axis of rotation to a path parallel to the centerline of the substrate transport chamber.

15. A method as in claim 10 where the robot drive comprises coaxial drive shafts at the singular fixed location, and where the robot drive is configured to move the robot arm in a vertical direction by moving the coaxial drive shafts up and down.

16. A method as in claim 10 where first and second ones of the links are located below a horizontal plane along a bottom of the process modules.

17. A method as in claim 10 where the substrate transport chamber comprises a chamber extension configured to be located at least partially between adjacent ones of the process modules, where the fixed singular location is located, at least partially, at the chamber extension.

18. A method as in claim 10 where the robot drive is configured to be retained at the fixed singular location on the substrate transport chamber while the robot arm is moved by the robot drive to move the at least one end effector among the at least one load lock and two or more sets of opposing ones of the process modules.

* * * * *